US012651852B2

(12) United States Patent
Yashiro et al.

(10) Patent No.: US 12,651,852 B2
(45) Date of Patent: Jun. 9, 2026

(54) MEMBER, CONDUCTIVE LAYER, METHOD FOR MANUFACTURING MEMBER, AND METHOD FOR FORMING CONDUCTIVE LAYER

(71) Applicants: Tohru Yashiro, Kanagawa (JP); Shinji Matsumoto, Kanagawa (JP); Takeshi Endoh, Kanagawa (JP); Yuko Komai, Kanagawa (JP); Hiroshi Kondo, Kanagawa (JP); Hiroyuki Takahashi, Kanagawa (JP); Muneaki Iwata, Kanagawa (JP); Tohru Hasegawa, Kanagawa (JP); Ryuya Mashiko, Tokyo (JP); Shinichi Hatanaka, Tokyo (JP); Hiroyuki Hiratsuka, Kanagawa (JP)

(72) Inventors: Tohru Yashiro, Kanagawa (JP); Shinji Matsumoto, Kanagawa (JP); Takeshi Endoh, Kanagawa (JP); Yuko Komai, Kanagawa (JP); Hiroshi Kondo, Kanagawa (JP); Hiroyuki Takahashi, Kanagawa (JP); Muneaki Iwata, Kanagawa (JP); Tohru Hasegawa, Kanagawa (JP); Ryuya Mashiko, Tokyo (JP); Shinichi Hatanaka, Tokyo (JP); Hiroyuki Hiratsuka, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 353 days.

(21) Appl. No.: 18/123,377

(22) Filed: Mar. 20, 2023

(65) Prior Publication Data

US 2023/0307407 A1 Sep. 28, 2023

(30) Foreign Application Priority Data

Mar. 22, 2022 (JP) ................................ 2022-045882
Mar. 22, 2022 (JP) ................................ 2022-046011
Jan. 20, 2023 (JP) ................................ 2023-007669

(51) Int. Cl.
*H01L 23/00* (2006.01)
*C09J 5/06* (2006.01)
(Continued)

(52) U.S. Cl.
CPC ................ *H01L 24/29* (2013.01); *C09J 5/06* (2013.01); *C09J 9/02* (2013.01); *C09J 163/00* (2013.01);
(Continued)

(58) Field of Classification Search
CPC H01B 5/16; H01L 24/26; H01L 24/28; H01L 24/29; H01L 24/31; H01L 24/32; H01R 4/04
See application file for complete search history.

(56) References Cited

U.S. PATENT DOCUMENTS

2012/0044659 A1* 2/2012 Rathburn ............ H01L 21/4867 29/841
2020/0185322 A1* 6/2020 Zhang ............... H01L 23/49811

FOREIGN PATENT DOCUMENTS

JP 2006-059998 3/2006
JP 2006-156221 6/2006
(Continued)

OTHER PUBLICATIONS

Watanabe et al. "Silver nanoparticle pastes for metal-metal jointing at low temperatures", 27th Japan Institute of Electronics Packaging Spring Conference, Preprints 13E-03, p. 109-110.
(Continued)

*Primary Examiner* — Zachary M Davis
(74) *Attorney, Agent, or Firm* — XSENSUS LLP

(57) ABSTRACT

A member includes a base material and a conductive layer. The conductive layer conducts heat or electricity. The con-
(Continued)

ductive layer includes a conductive portion and a non-conductive portion. The conductive portion conducts heat or electricity. The conductive portion is disposed on at least one of an upper surface or a lower surface of the non-conductive portion and on a side surface of the non-conductive portion.

17 Claims, 20 Drawing Sheets

(51) Int. Cl.

| | |
|---|---|
| ***C09J 9/02*** | (2006.01) |
| ***C09J 163/00*** | (2006.01) |
| ***H01B 5/16*** | (2006.01) |
| ***H01R 4/04*** | (2006.01) |

(52) U.S. Cl.

CPC ................. *H01B 5/16* (2013.01); *H01R 4/04* (2013.01); *C09J 2463/00* (2013.01); *H01L 24/32* (2013.01); *H01L 2224/27312* (2013.01); *H01L 2224/27334* (2013.01); *H01L 2224/29019* (2013.01); *H01L 2224/29083* (2013.01); *H01L 2224/2929* (2013.01); *H01L 2224/29324* (2013.01); *H01L 2224/29339* (2013.01); *H01L 2224/29344* (2013.01); *H01L 2224/29347* (2013.01); *H01L 2224/29387* (2013.01); *H01L 2224/29393* (2013.01); *H01L 2224/29499* (2013.01); *H01L 2224/32221* (2013.01); *H01L 2924/01006* (2013.01); *H01L 2924/0503* (2013.01); *H01L 2924/05032* (2013.01); *H01L 2924/05432* (2013.01); *H01L 2924/05442* (2013.01); *H01L 2924/0665* (2013.01)

(56) References Cited

FOREIGN PATENT DOCUMENTS

| | | |
|---|---|---|
| JP | 2015-015322 | 1/2015 |
| WO | WO2020/091008 A1 | 5/2020 |
| WO | WO2020/095902 A1 | 5/2020 |

OTHER PUBLICATIONS

Kanetsuki et al. "Thermophysical Property Evaluation Technique for Sintered Bonding Materials", Kobelco Research Institute Technical Report, No. 50 vol. 28 Apr. 2020, 3 pages.

Shin-Etsu Chemical Co., Ltd. [retrieved on Mar. 13, 2023]. Retrieved from the Internet https://www.shinetsusilicone-global.com/products/function/heat/index.shtml, 6 pages.

* cited by examiner

START

S1
PREPARE BOTTOM COMPONENT

S2
PRETREATMENT OF BOTTOM COMPONENT

S3
APPLY INK FOR FORMING SUPPORT PORTION

S4
POST-TREATMENT

S5
APPLY INK FOR FORMING CONDUCTIVE PORTION

S6
POST-TREATMENT

S7
APPLY INK FOR FORMING SUPPORT PORTION

S8
POST-TREATMENT

S9
PREPARE TOP COMPONENT BEFORE LAMINATION

S10
LAMINATE TOP COMPONENT

END

MEMBER, CONDUCTIVE LAYER, METHOD FOR MANUFACTURING MEMBER, AND METHOD FOR FORMING CONDUCTIVE LAYER

CROSS-REFERENCE TO RELATED APPLICATIONS

This patent application is based on and claims priority pursuant to 35 U.S.C. § 119(a) to Japanese Patent Application Nos. 2022-045882, filed on Mar. 22, 2022, 2022-046011, filed on Mar. 22, 2022, and 2023-007669, filed on Jan. 20, 2023, in the Japan Patent Office, the entire disclosure of which is hereby incorporated by reference herein.

BACKGROUND

Technical Field

Embodiments of the present disclosure relate to a member, a conductive layer, a method for manufacturing a member, and a method for forming a conductive layer.

Related Art

For example, a thermally conductive adhesive layer includes a bump formed of thermally conductive paste and an adhesive layer formed of an adhesive filled around the bump. The bump makes it possible to promote thermal conductivity between members to be adhered and the adhesive layer makes it possible to mechanically adhere the members to be adhered. As a result, both mechanical adhesive strength and thermal conductivity can be improved.

SUMMARY

According to an embodiment of the present disclosure, a member includes a base material and a conductive layer. The conductive layer conducts heat or electricity. The conductive layer includes a conductive portion and a non-conductive portion. The conductive portion conducts heat or electricity. The conductive portion is disposed on at least one of an upper surface or a lower surface of the non-conductive portion and on a side surface of the non-conductive portion.

According to another embodiment of the present disclosure, there is provided a method for manufacturing a member. The method includes forming a conductive layer having a conductive portion and anon-conductive portion on a base material. The forming the conductive layer includes applying a conductive portion forming composition containing a thermally conductive material or an electrically conductive material to either an upper surface or a lower surface of the non-conductive portion and to a side surface of the non-conductive portion to form the conductive portion.

According to still another embodiment of the present disclosure, a conductive layer includes a conductive portion and a non-conductive portion. The conductive portion conducts heat or electricity. The conductive portion is disposed on at least one of an upper surface or a lower surface of the non-conductive portion and on a side surface of the non-conductive portion.

According to still yet another embodiment of the present disclosure, there is provided a method for forming a conductive layer including a conductive portion that conducts heat or electricity and a non-conductive portion. The method includes applying a conductive portion forming composition containing a thermally conductive material or an electrically conductive material to either an upper surface or a lower surface of the non-conductive portion and to a side surface of the non-conductive portion, to form the conductive portion.

BRIEF DESCRIPTION OF THE DRAWINGS

A more complete appreciation of embodiments of the present disclosure and many of the attendant advantages and features thereof can be readily obtained and understood from the following detailed description with reference to the accompanying drawings, wherein:

FIGS. 20A-1, 20A-2, 20B-1, 20B-2, 20C-1, 20C-2, 20D, and 20E are cross-sectional views for explaining a seventh modification of the manufacturing method for the present embodiment;

Figure 1A:
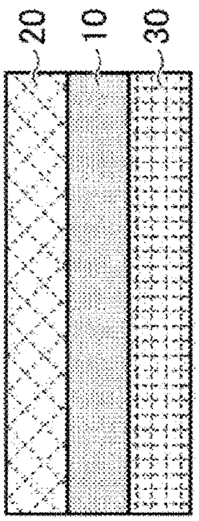
FIGS. 1A to 1C are diagrams illustrating examples of the layered structure of a conductive layer according to one embodiment of the present disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an." and "the" are intended to include the plural forms as well, unless the context clearly indicates otherwise.

An embodiment for implementing the present disclosure will be described below with reference to the drawings. In the description of the drawings, the same reference numerals are used for the same components, and redundant description is omitted.

EMBODIMENTS

Figure 1B:
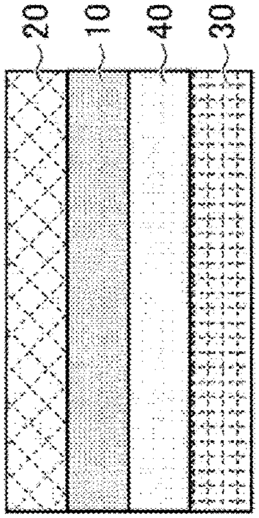
Figure 1C:
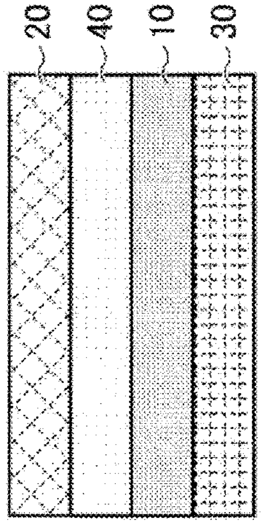

FIGS. 1A, 1B, and 1C are diagrams illustrating examples of the layered structure of a member using a conductive layer of the present embodiment. In FIGS. 1A, 1B, and 1C, a conductive layer 10 transfers heat from a heat-generating component 30 to a cooling component 20 to radiate the heat from the heat-generating component 30. Specific examples of the heat-generating electronic component 30 include, but are not limited to, an integrated circuit (IC) chip, a battery, a light emitting diode (LED), a capacitor, a resistor, and a diode. The cooling component 20 cools the heat from the heat-generating component 30 by air cooling, liquid cooling, phase-change cooling, and thermoelectric cooling. Specific examples of the cooling component 20 include, but are not limited to, a heat sink, a heat pipe, a microchannel, a Peltier element, a heat radiation sheet, and a heat spreader.

The conductive layer 10 and the heat-generating component 30 and/or the conductive layer 10 and the cooling component 20 may be formed with an intermediate layer 40 (FIGS. 1B and 1C) therebetween. Examples of the intermediate layer 40 include, but are not limited to, a heat diffusion layer that diffuses heat in a planar direction and a surface treatment layer for improving adhesiveness. Configuration requirements of the conductive layer 10 will be described later.

<Intermediate Layer (Heat Diffusion Layer)>

As a material of the heat diffusion layer, metals (such as Ag, Cu, Au, and Al), carbon, and ceramics (such as $SiO_2$, $Al_2O_3$, AlN, and BN), which have excellent thermal conductivity, can be used, for example.

The thickness of the heat diffusion layer is optimized by heat radiation design, and is generally from 0.05 μm or more to 10 μm or less, if the heat diffusion layer is formed by vacuum deposition of a metal material such as metals (Ag, Cu, Au, and Al). The thickness of the heat diffusion layer is generally from 1 μm or more to 300 μm or less, if the heat diffusion layer is formed by applying a carbon material using carbon nanoparticle ink or graphene ink. The thickness of the heat diffusion layer is from 1 μm or more to 500 μm or less, if the heat diffusion layer is formed by applying a ceramic material as a ceramic paste in which ceramic particles and a resin are mixed.

A method for forming a layer of a metal material by vacuum deposition includes, but is not limited to, vacuum vapor deposition, sputtering, ion plating, and chemical vapor deposition (CVD). Among these, the sputtering, which realizes high-speed film formation, is preferable. A method for wet film formation includes, but is not limited to, plating.

The application method using metal ink and carbon ink and the application method using a ceramic paste are not particularly limited and may be appropriately selected according to the purpose. Examples thereof include, but are not limited to, spin coating, casting, micro gravure coating, gravure coating, bar coating, roll coating, wire bar coating, dip coating, slit coating, capillary coating, spray coating, nozzle coating, dispense coating, and various printing methods such as gravure printing, screen printing, flexographic printing, offset printing, reverse printing, and inkjet printing.

<Intermediate Layer (Surface Treatment Layer)>

The surface treatment layer is formed as a layer that adjusts wettability or surface energy of the film surface, and is formed as a resin film having a hydrophilic group or a hydrophobic group on the surface. For example, a material having a carboxyl group, an amino group, a keto group, an OH group, a fluorine group, or a silanol group in the resin structure can be used as a material of the surface treatment layer.

Inorganic particles such as ceramics (such as $SiO_2$, $Al_2O_3$, AlN, and BN), metals (such as Ag, Cu, Au, and Al), and carbon can also be mixed with the material. The thickness of the surface treatment layer is generally in the range from 0.5 μm or more to 10 μm or less. The method for forming the surface treatment layer is not particularly limited and may be appropriately selected according to the purpose. For example, the surface treatment layer can be formed by applying a mixture of an organic monomer material having at least a reactive group and a resin material or an inorganic material in which an initiator is mixed, and then performing curing treatment such as UV irradiation, heat treatment, and dehydration treatment.

Examples of the application method include, but are not limited to, spin coating, casting, micro gravure coating, gravure coating, bar coating, roll coating, wire bar coating, dip coating, slit coating, capillary coating, spray coating, nozzle coating, dispense coating, and various printing methods such as gravure printing, screen printing, flexographic printing, offset printing, reverse printing, and inkjet printing.

Figure 2:
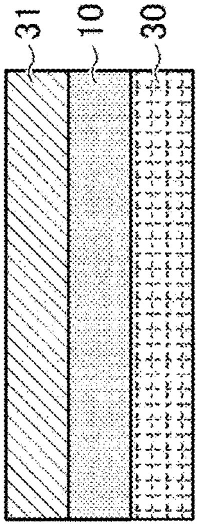
FIG. 2 is a diagram illustrating a first modification of the layered structure of the present embodiment.
Figures 1, 20A:
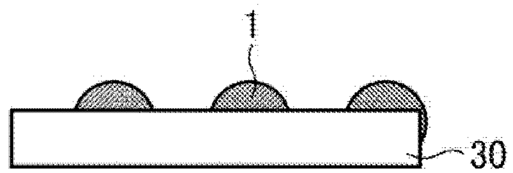
Figures 2, 20A:
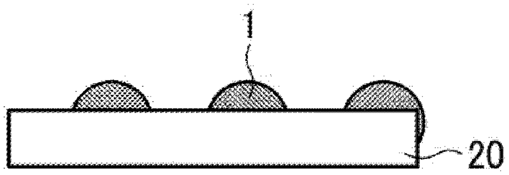
Figures 1, 20B:
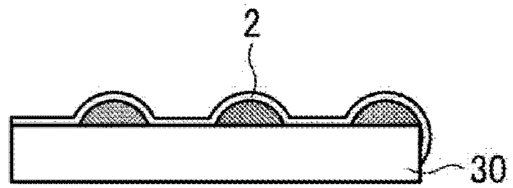
Figures 2, 20B:
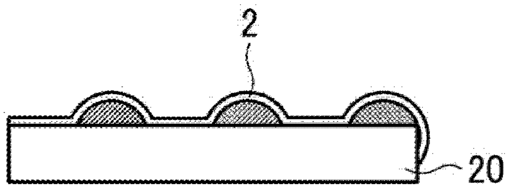
Figures 1, 20C:
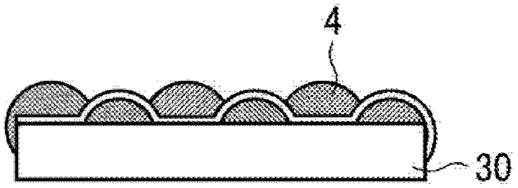
Figures 2, 20C:
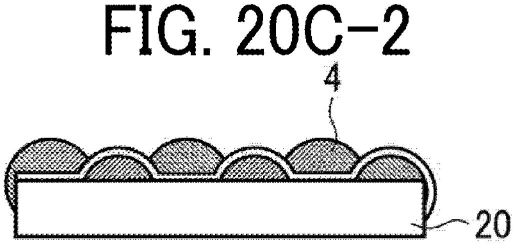
Figure 20D:
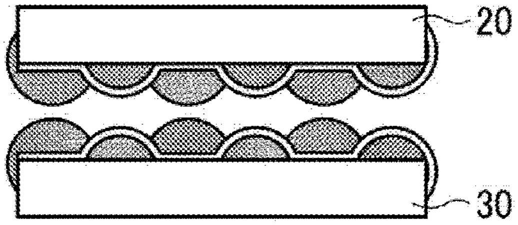
Figure 20E:
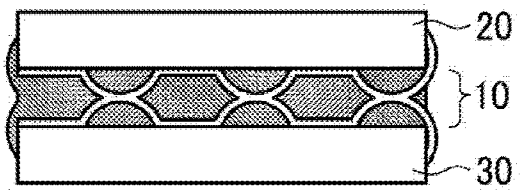

FIG. 2 illustrates a layered structure of a first modification using the conductive layer of the present embodiment. A configuration example in FIG. 2 differs from that in FIG. 1 in that the cooling component 20 is replaced by a second heat-generating component 31. The configuration in FIG. 2 is effective in reducing and equalizing a temperature difference between the first heat-generating component 30 and the second heat-generating component 31.

Figure 3:
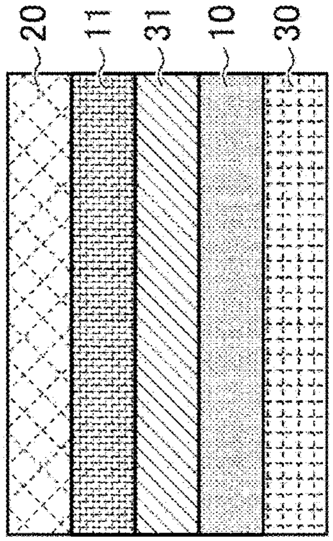
FIG. 3 is a diagram illustrating a second modification of the layered structure of the present embodiment.

FIG. 3 illustrates a layered structure of a second modification in a case where the conductive layer 10 of the present embodiment is used. An example of a layered structure in FIG. 3 differs from those in FIGS. 1 and 2 in that the cooling component 20 is formed on the second heat-generating component 31 of FIG. 2, with a second conductive layer 11 interposed therebetween. This structure is effective when heat is radiated from a plurality (two) of the heat-generating components 30 in FIG. 3 to the cooling component 20. The conductive layer 10 and the conductive layer 11 may be the same as each other or may be different from each other in conductivity, film structure, and film thickness.

Figure 4:
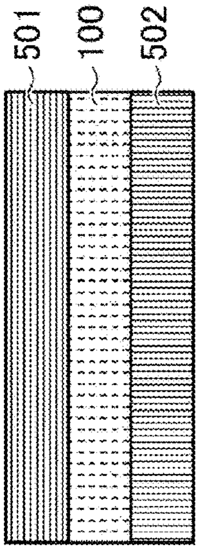
FIG. 4 is a diagram illustrating a third modification of the layered structure of the present embodiment.

FIG. 4 illustrates a layered structure of a third modification in a case where the conductive layer 10 of the present embodiment is applied as an electrically conductive layer 100. In FIG. 4, the electrically conductive layer 100 electrically connects an electrode 501 and an electrode 502. As materials of the electrode 501 and the electrode 502, general electrode materials can be used, and specific examples thereof include, but are not limited to, Ag, Cu, Au, Al, Ni, Sn, Pb, mixtures of these materials, and carbon materials.

<Conductive Layer>

Figure 5B:
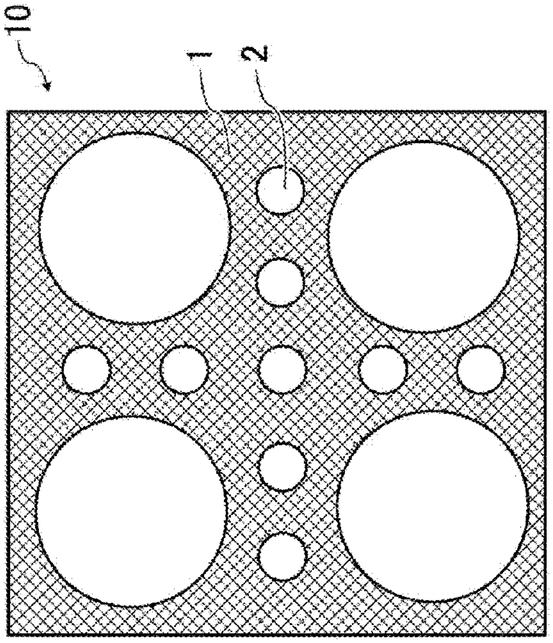
FIG. 5A is a cross-sectional view and FIG. 5B is a plan view for explaining the present embodiment.
Figure 5A:
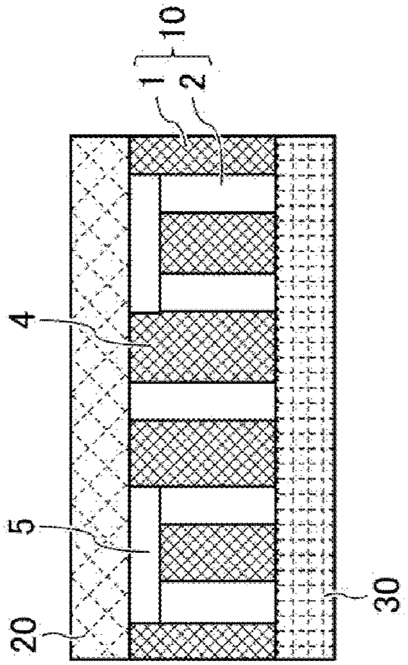

Next, the conductive layer 10 of the present embodiment will be described. FIGS. 5A and 5B illustrate the conductive layer 10 of the present embodiment in a schematic cross-sectional view in a film thickness direction and a schematic top view as seen from the cooling component 20 side.

The conductive layer 10 is a conductive layer that includes a conductive portion 2 that conducts heat or electricity and a non-conductive portion 1, and the conductive portion is disposed on at least one of an upper surface or a lower surface of the non-conductive portion and on a side surface of the non-conductive portion. Thus, the conductive portion 2 is disposed on at least one of the upper surface or the lower surface of the non-conductive portion 1 and on a side surface of the non-conductive portion 1, so that a contact area between the conductive portion 2 and the non-conductive portion 1 is increased and contact therebetween occurs from multiple directions, thereby increasing shearing stress and fixing force. Stable fixation leads to high conductivity. In other words, the conductive layer 10 is excellent in stability and reliability, and has excellent thermal or electrical conduction function, adhesive strength of the conductive portion 2, film strength of the conductive layer 10. A member having the conductive layer 10 excellent in reliability and a base material 30, such as a heat-generating component 30, is excellent in reliability.

The conductive portion 2 may not be disposed on all of at least one of the upper surface or the lower surface of the non-conductive portion 1 and on all of the side surface of the non-conductive portion 1. To the extent that the above effect is achieved, the conductive portion 2 may be formed and disposed intermittently on at least one of the upper surface or the lower surface of the non-conductive portion 1 and on the side surface of the non-conductive portion 1, even if the conductive portion 2 is not disposed on a part of at least one of the upper surface or the lower surface of the non-conductive portion 1 and on a part of the side surface of the non-conductive portion 1.

The heat-generating component 30 illustrated in FIGS. 5A and 5B is referred to as a bottom component or a base material, and the cooling component 20 is referred to as a top component or a member to be conducted or another base material. Here, a vertical positional relationship is in accordance with the description above, and a support portion 1 is formed on an upper surface of the bottom component or the base material (also referred to as heat-generating component). A filling portion 4 is formed on a side surface of the conductive portion 2. The support portion 1 is an example of a non-conductive portion. The filling portion 4 is an example of another non-conductive portion.

In a case where a heat-generating component such as an LED is mounted to a ceramic package, a heat source may be reversed such that the heat-generating component is used as the top component and the ceramic package is used as the bottom component. However, the vertical relationship of the top component 20 and the bottom component 30 can be considered in the same way, and the positional relationship is such that the support portion 1 contacts the bottom component 30 and the filling portion 4 contacts the top component 20.

In the conductive layer 10, the conductive portion 2 is sandwiched between the support portion 1 and the filling portion 4 that is filled into a space on a lateral side of the conductive portion 2. The conductive portion 2 is sandwiched by the non-conductive portion (support portion 1) and the other non-conductive portion (filling portion 4). This increases the stable fixing force and conductivity with no separation of the conductive portion 2 from the support portion 1.

The conductive layer 10 is disposed between the base material 30, which is the heat-generating component 30, and a member to be conducted 20, which is the cooling component, and the filling portion 4 (including support portion 1) has a portion that is continuously formed between opposed ends of the conductive layer 10. The other non-conductive portion 4 (non-conductive portion 1) has a portion that is formed continuously between the opposed ends of the conductive layer 10. Thus, it is possible to form the non-conductive portion (the support portion 1 and the filling portion 4) directly on each of the top and bottom components (the heat-generating component 30 and the cooling component 20) to improve adhesion between the conductive layer 10 and the components. Here, the end portion refers to a portion corresponding to an interface between the conductive layer 10 and the base material 30 or the member to be conducted 20. The end portion includes an upper surface and a lower surface of the conductive layer 10, but not a side surface of the conductive layer 10.

Figure 6B:
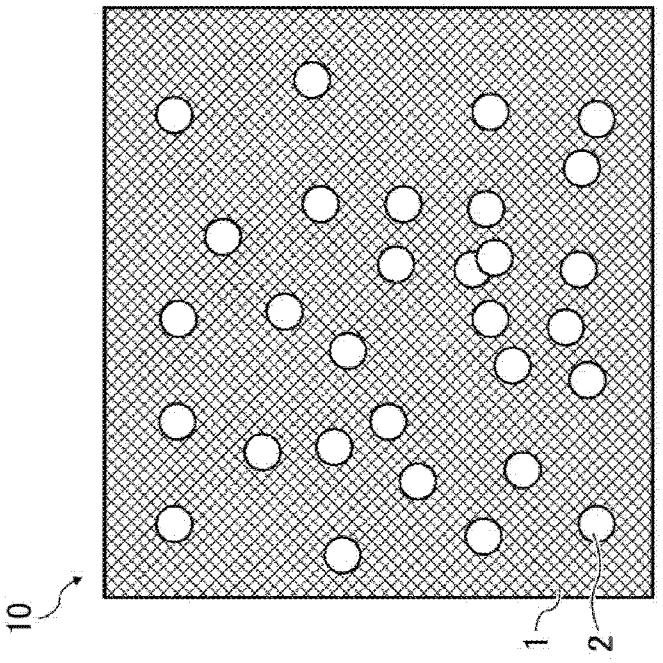
FIG. 6A is a cross-sectional view and FIG. 6B is a plan view for explaining a comparative example.
Figure 6A:
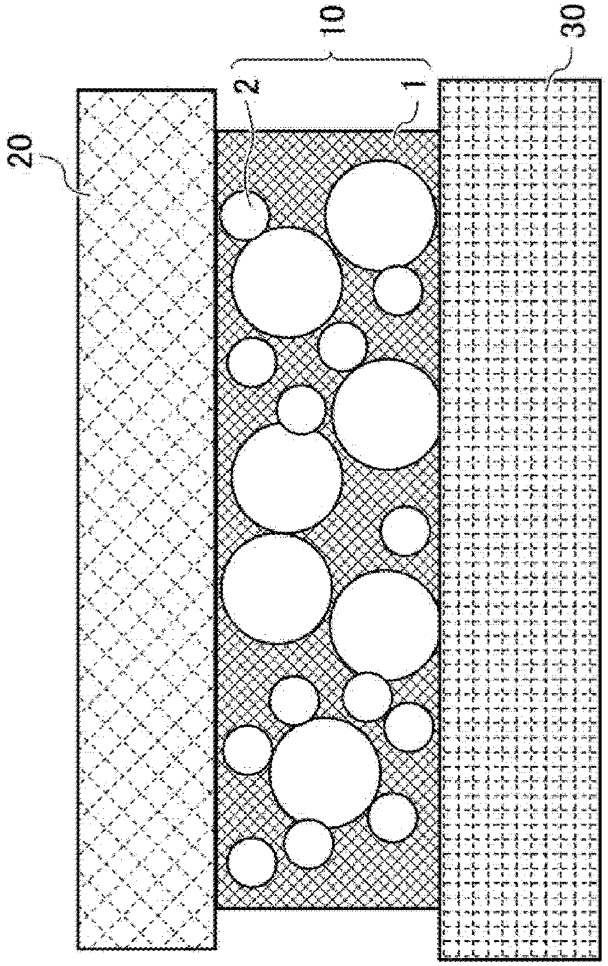

If a conductive layer (paste-like conductive member), in which conventional thermally conductive particles are mixed with a resin (FIGS. 6A and 6B), is attached (pressed) to a member, the thermally conductive particles contact each other to form thermally conductive contact points, and thus, process variation due to pressing condition is large. The thermally conductive particles are in point contact with each other, and thus, to increase thermal conductivity, it is preferable to form a mixed layer having a high concentration of the thermally conductive particles. However, this reduces the adhesive strength of the adhesion surface.

In addition, if the viscosity of the paste ink mixed with the thermally conductive particles having the high concentration increases, a process of coating and forming the conductive layer is restricted. The thermally conductive particles are also in point contact at a contact surface with the heat-generating component and the cooling component, which makes it difficult to lower a thermal contact resistance. If a size of the thermally conductive particles is increased to reduce the number of contacts, a thickness of the conductive layer increases, resulting in a problem that the thermal resistance does not decrease.

In regard to these problems, in the conductive layer 10 of the present embodiment, the conductive portion 2 is formed so that the added amount of thermally conductive particles is a high concentration volume %, to form the conductive layer 10 having high thermal conductivity.

The conductive layer 10 has a bonding portion 5 extending in a plane direction that couples a plurality of the conductive portions 2. The conductive layer 10 includes a plurality of non-conductive portions and a plurality of the conductive portions, and a plurality of conductive portions are coupled. Thus, the conductive capacity in the plane direction can be improved. The contact surface between the conductive layer 10 and the heat-generating component 30 or the cooling member 20 can be enlarged, and contact resistance can be reduced even when flexibility of surface of the conductive portion is decreased due to a small added amount of resin binder mixed in the conductive portion. By using a metal nanoparticle sintering material for the conductive layer, a plurality of integrated highly conductive portions that have flat contact surfaces can be formed continuously in a thickness direction of a resin portion that serves as the support portion 1. In the conductive layer 10, a plurality of the support portions 1 are included, and the conductive portions 2 covering each of the plurality of support portions 1 can be coupled to each other, and when the plurality of conductive portions 2 are coupled, any diffusion path and diffusion distribution can be formed, and thus, the conduction efficiency can be improved.

As will be described later in the present embodiment, a method for forming the conductive portion 2 by inkjet printing is suitable as a manufacturing method. Unlike in a conventional paste ink, in a conductive member ink utilized here, the amount of resin added to the conductive member ink is small, which makes it possible to prevent an increase in viscosity of the conductive member ink. The conductive layer 10 can be thinly formed by separately coating the conductive portion 2 and the support portion 1. The conductive member ink is an example of a conductive portion forming composition and is preferably a liquid at room temperature that can be discharged by inkjet.

<Conductive Portion>

The conductive portion 2 of the present embodiment has a function of conducting heat in the thickness direction by being formed continuously in a film thickness direction.

The conductive portion 2 is formed of a thermally conductive material, and examples thereof include, but are not limited to, metal materials (such as Ag, Cu, Au, and Al), carbon, and ceramic materials (such as $SiO_2$, $Al_2O_3$, AlN, and BN). The conductive portion 2 can be formed by applying ink in which particles of these thermally conductive materials are mixed with a resin, a solvent, or the like.

A particle diameter can be in a range from 0.01 μm or more to 100 μm or less, and a content of the thermally conductive material in the conductive portion is from 40 percent by volume (vol %) or more to 100 vol % or less, preferably from 60 vol % or more to 100 vol % or less. If the content of the thermally conductive material is higher, the thermal conductivity is higher.

Among the thermally conductive materials, metal materials are preferable, and can be used as an electrically conductive material. These materials can be applied as a metal nanoparticle layer and then sintered by heat or light, to form the conductive portion 2 having high thermal conductivity in which particles are sintered.

The particle diameter is small, so that the unevenness of the contact surface with the heat-generating component and the cooling component is small, which makes it possible to form the integrated highly conductive portion that has a flat contact surface. The metal nanoparticle layer can be formed by applying metal nanoparticle ink. As the particle diameter of nanoparticles, a size of 5 nm or more to 1000 nm or less can be used, and ink, in which particles having a particle diameter of 200 nm or less that can be sintered at a relatively low temperature of about 150° C. are dispersed in a solvent or resin, is preferred. An average surface roughness Ra of the coating film is preferably 200 nm or less.

Precise patterning can be achieved, for example, by using small-diameter particles to obtain a thin conductive layer or by applying inkjet printing with a small-diameter nozzle. The metal nanoparticle ink contains solid components such as a dispersing material and a viscosity adjusting material in addition to the solvent, and a product containing 5 wt % or less of solid components relative to the metal ink is particularly preferable. It is possible to form the conductive portion 2 having a metal content of 95 vol % or more by means of removal by decomposition or gasification during sintering.

For these metal nanoparticle inks, commercially available materials can be used. Examples thereof include the materials in Table 1.

TABLE 1

| Metal species | Manufacturer | Product name | Metal content (wt %) | Particle diameter (nm) |
|---|---|---|---|---|
| Ag particles | DAICEL | PICOSIL DNS0150I | 50 | 20-30 |
| | DAICEL | PICOSIL DNS0404P | 60-70 | <200 |
| | DAICEL | PICOSIL DNS0215P | 67-78 | <200 |
| | GenesInk | SMART INK Smart Jet I (S-CS01520) | 20 | <100 |
| | PVnanocell | SICRYS I40DM-106 | 40 | 70 |
| | PVnanocell | SICRYS I50DM-106 | 50 | 80 |
| | PVnanocell | SICRYS I50TM-115 | 50 | 70 |
| | PVnanocell | SICRYS I50TM-119 | 50 | 70 |
| | PVnanocell | SICRYS I50T-13 | 50 | 70 |
| | ULVAC | L-Ag1TeH | 50-60 | 3-7 |
| | Bando Chemical Industries | Flow Metal ® SW1020 | 40 | 23-33 |
| | Bando Chemical Industries | FlowMetal ® SR7000 | 60 | 30 |
| | Bando Chemical Industries | FlowMetal ® SR7500 | 50 | 30 |
| | Future Ink | F-NANO IJ100GE | 50 | 160 |
| | Future Ink | F-NANO IJ200GE | 37 | 16 |
| | NovaCentrix | METALON JS-A101A | 40 | 30-50 |
| | NovaCentrix | METALON JS-A102A | 40 | 30-50 |
| | NovaCentrix | METALON JS-A191 | 40 | 30-50 |
| | Kishu Giken Kogyo | AGK101, AGK102 | 35 | <200 |
| | Kishu Giken Kogyo | AGK103, AGK104 | 65 | <200 |
| | C-INK | DryCure ® Ag-J 0410B, 1010B | 10 | <200 |
| | C-INK | DryCure ® Ag-J 0420B, 1020B | 20 | <200 |
| Silver salt | Electroninks | EI-710 Ink | 12 | |
| | InkTec | TEC-IJ-010 | 15 | |

TABLE 1-continued

| Metal species | Manufacturer | Product name | Metal content (wt %) | Particle diameter (nm) |
|---|---|---|---|---|
| Cu particles | ISHIHARA CHEMICAL | IJ-02 | 35-45 | <70 |
| | ISHIHARA CHEMICAL | IJ-02A | 35-45 | <70 |
| | PVnanocell | SICRYS IC50DM-7 | 50 wt % | 50 |
| | PVnanocell | SICRYS IC50TM-8 | 50 wt % | 50 |
| | FUKUDA METAL FOIL & POWDER | DC-50 | 20 wt % | 50 |
| | NovaCentrix | METALON CI-004 | 20 wt % | <200 |
| | NovaCentrix | METALON CI-005 | 26 wt % | <200 |
| Au particles | C-INK | DryCure ® Au-J 0410B, 1010B | 10 wt % | <200 |

The thickness of the conductive portion 2 is in the range from 1 μm or more to 500 μm or less, and is preferably from 1 μm or more to 100 μm or less to obtain a thin film to lower the thermal resistance. The thickness of the conductive portion 2 is preferably 1 μm or more, since the conductive portion 2 can easily follow the unevenness on the surface of the heat-generating component and/or the cooling component to reduce the contact resistance.

The conductive portion 2 in the conductive layer 10 can be adjusted in a range from 5 vol % or more to 90 vol % or less. When the volume percentage of the conductive portion 2 is 90 vol % or less, the volume of the resin portion, which is the support portion 1, increases relatively, which makes it easier to obtain adhesiveness to the heat-generating component and/or the cooling component. On the other hand, when the volume percentage of the conductive portion 2 is 5 vol % or more, thermal conductivity is easier to obtain A preferred range is from 5 vol % or more to 50 vol % or less.

Examples of a method for applying the metal nanoparticle ink as the conductive portion 2 include, but are not limited to, spin coating, casting, micro gravure coating, gravure coating, bar coating, roll coating, wire bar coating, dip coating, slit coating, capillary coating, spray coating, nozzle coating, dispense coating, and various printing methods such as gravure printing, screen printing, flexographic printing, offset printing, reverse printing, and inkjet printing. Particularly preferable is inkjet printing coating and screen printing coating that allows for thin film formation and precise patterning film formation.

When forming a conductive layer of a metal-based material, in addition to the method for using metal particle ink, a method for reducing and depositing metal solution ink can be used. The metal solution ink is generally known as silver salt ink, and these types of ink can also be used.

<Non-Conductive Portions (Support Portion, Filling Portion)>

The non-conductive portion is relatively less conductive than the conductive portion and has mechanical adhesive strength. An example will be described in which a resin is used in members of the non-conductive portions corresponding to the support portion 1 and the filling portion 4. The support portion 1 (filling portion 4) has a function of obtaining mechanical adhesive strength with the heat-generating component 30 and/or the cooling component 20, and is mainly formed of a resin material. As a resin material having an adhesion function, a photocurable resin, a thermosetting resin, or a material obtained by adding inorganic particles to these resins can be used. Conductivity of the conductive layer is improved by containing inorganic particles that are thermally and electrically conductive. In addition, effects such as improving the mechanical strength of the conductive layer can be obtained.

Examples of resin materials include, but are not limited to, a urethane resin, an epoxy resin, a phenol resin, a polyimide resin, an ester resin, a vinyl resin, a silicone resin, a styrene resin, a cellulose resin, an amide resin, a (meth) acrylic resin, a melamine resin, a fluororesin, and a mixture of a plurality of kinds of these.

Among these, the epoxy resin, the silicone resin, and the polyimide resin have good heat resistance and are preferable, and the epoxy resin has small curing shrinkage and thus is particularly preferable. Furthermore, it is particularly preferable to add a low elastic resin material having a low softening temperature (Tg) to these curable resins to reduce thermal stress. The (Meth) acrylic resin is preferred as a low elasticity resin. If high heat resistance is not required, the (meth)acrylic resin can be used alone.

The filling portion 4 and the support portion 1 may be formed of the same resin material or may be formed of a different resin material. The filling portion 4 is formed in the conductive layer 10 where the conductive portion 2 and the support portion 1 that is not the filling portion are not formed. Examples of a patterning method include, but are not limited to, a method for forming the conductive portion 2 and the filling portion 4 in a gap obtained by pattern-forming the support portion 1 that is not the filling portion, a method for forming the filling portion 4 in a gap obtained by pattern-forming the conductive portion 2, and a method for pattern-forming the filling portion 4. When pattern-forming the support portion 1 that is not the filling portion, the conductive portion 2, and the filling portion 4, a part of these portions in the thickness direction may be pattern-formed and then, another part of these portions may be formed.

A particularly preferable method is to pattern-form the support portion 1 that is not the filling portion and/or the filling portion 4 first. Highly accurate pattern formation is possible by performing pattern-forming and photocuring of a resin, which is the support portion 1, at the same time. That is, pattern formation can be achieved by photocuring droplets immediately after inkjet printing, screen printing, or dispense coating.

In particular, an inkjet printing system in which a UV-LED array is mounted to an inkjet head enables high-precision pattern formation by immediately curing jetted, impacted droplets with a UV-LED. The ink applied in inkjet printing is discharged from a nozzle having a small diameter, and thus, ink having a low viscosity of about 5 mPa*s or more to 200 mPa*s or less is generally preferable.

In inkjet printing, dispense coating, and spray coating, pattern formation without using a plate is possible and a conductive layer can be applied directly to a formation surface. Therefore, the conductive layer can be formed as a thinner film and the productivity is higher than in a method for cutting and attaching a conductive layer sheet manufactured in advance. Inkjet printing is excellent in fine pattern formation and thus is a particularly preferable coating method.

The support portion 1 can be formed by applying, to a contact target, ink for forming the support portion and/or ink for forming the filling portion containing a monomer component of the resin, and then, performing a polymerization reaction.

<<<Ink for Forming Support Portion>>>

The ink for forming the support portion may contain the resin, may contain the monomer component of the resin and a polymerization initiator, and may further contain other components as desired. However, the ink preferably contains the monomer component of the resin and the polymerization initiator in view of excellent performance of patterning. The ink for forming the support portion is an example of a non-conductive portion forming composition and is preferably a liquid at room temperature that can be discharged by inkjet.

——Monomer Component——

The monomer component of the resin is not particularly limited and may be appropriately selected depending on the type of resin to be used. Examples thereof include, but are not limited to, an epoxy monomer, a (meth)acrylate monomer, an oxetane monomer, a urethane monomer, and a silicone monomer. Each of these may be used alone or in combination with others. Among these, an epoxy monomer is preferably contained as the monomer component of the resin.

——Epoxy Monomer——

The epoxy monomer is not particularly limited and may be appropriately selected according to the purpose. Examples thereof include, but are not limited to, an alicyclic epoxy monomer, a glycidyl ether type epoxy monomer, and a glycidylamine type epoxy monomer. The alicyclic epoxy has a high glass transition temperature (Tg), excellent heat resistance, and low monomer viscosity due to the ring structure thereof. The glycidyl ether epoxy monomer is easy to adjust the elastic modulus of a cured material to a low elasticity and has a low monomer viscosity. The glycidylamine type epoxy monomer is easy to obtain adhesive strength. A mixture of various epoxy monomers with the above characteristics can be used as ink for forming an adhesive portion, which is suitable for the inkjet method.

Examples of the alicyclic epoxy monomer include, but are not limited to, compounds represented by any one of Structural Formulas 1 to 16 below. Each of these may be used alone or in combination with others.

[Chem. 1]

Structural Formula 1

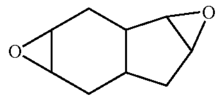

Structural Formula 2

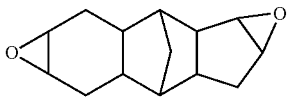

Structural Formula 3

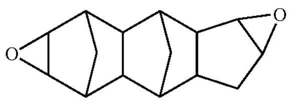

Structural Formula 4

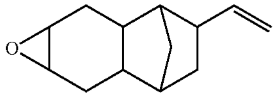

Structural Formula 5

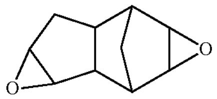

-continued

Structural Formula 6

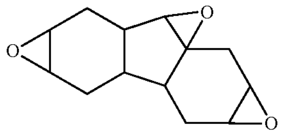

Structural Formula 7

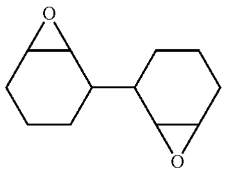

Structural Formula 8

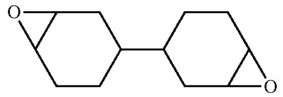

Structural Formula 9

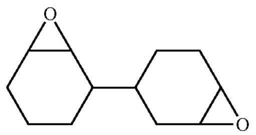

Structural Formula 10

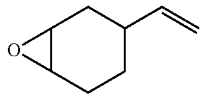

Structural Formula 11

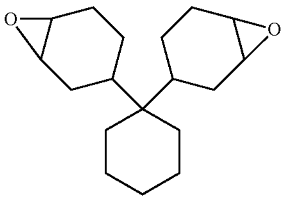

Structural Formula 12

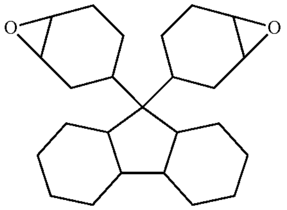

Structural Formula 13

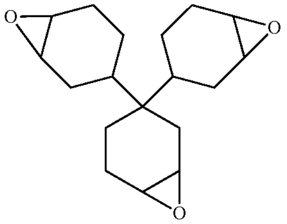

Structural Formula 14

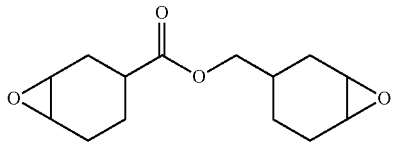

-continued

Structural Formula 15

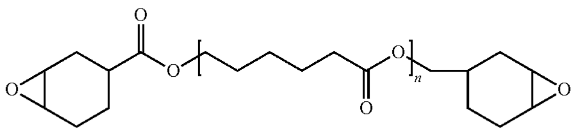

Structural Formula 16

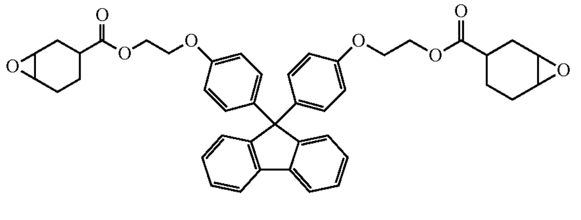

(where in Structural Formula 15, n represents an integer of 1 or 2)

As the alicyclic epoxy monomer, an appropriately synthesized alicyclic epoxy monomer may be used, or a commercially available alicyclic epoxy monomer may be used. Examples of the commercially available alicyclic monomer include, but are not limited to, EPOCHALIC THI-DE, EPOCHALIC DE-102, EPOCHALIC DE-103. VNBB-ME (all manufactured by ENEOS Corporation), DCPD-DE (manufactured by Japan Material Technologies Corporation), CELLOXIDE (CEL) 8010P, CEL2010P, CEL2081, and CEL2000 (all manufactured by Daicel Corporation).

Examples of the glycidyl ether type epoxy monomer include, but are not limited to, allyl diglycidyl ether and bisphenol type diglycidyl ether. Specific examples thereof include, but are not limited to, compounds represented by any one of Structural Formulas 17 to 24 below. Each of these may be used alone or in combination with others.

[Chem. 2]

Structurual Formula 17

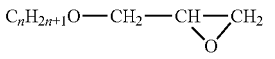

Structurual Formula 18

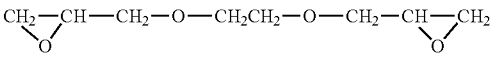

Structurual Formula 19

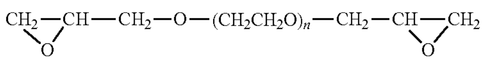

Structurual Formula 20

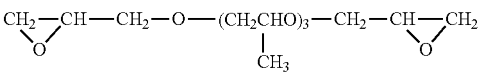

Structurual Formula 21

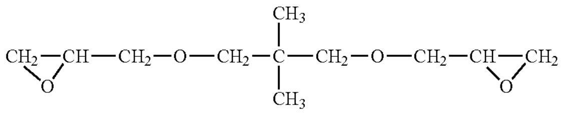

Structurual Formula 22

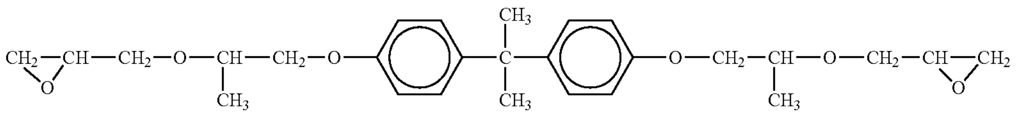

Structurual Formula 23

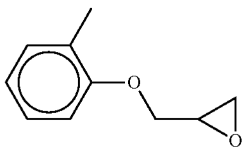

Structurual Formula 24

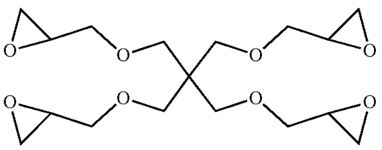

(where in Structural Formula 17, n represents 12, and in Structural Formula 19, n represents 9)

As the glycidyl ether type epoxy monomer, an appropriately synthesized glycidyl ether type epoxy monomer may be used, or a commercially available glycidyl ether type epoxy monomer may be used.

Examples of the commercially available glycidyl ether type epoxy monomer include, but are not limited to, RIKARESIN DME-100 (manufactured by New Japan Chemical Co., Ltd.), EPOLIGHT M-1230, EPOLIGHT 40E, EPOLIGHT 100E, EPOLIGHT 200E, EPOLIGHT 400E, EPOLIGHT 70P, EPOLIGHT 200P, EPOLIGHT 400P, EPOLIGHT 1500NP, EPOLIGHT 1600, EPOLIGHT 80MF, EPOLIGHT 100MF (all manufactured by Kyoeisha Chemical Co., Ltd.), SHOFREE (registered trademark) PETG, SHOFREE (registered trademark) BATG (both manufactured by Showa Denko K.K.), DENACOL EX-614B, DENACOL EX-313, DENACOL EX-512, DENACOL EX-321, DENACOL EX-321L, DENACOL EX-612, DENACOL EX-614, DENACOL EX-622, DENACOL EX-314, DENACOL EX-421, DENACOL EX-521, DENACOL EX-411, DENACOL EX-171, DENACOL EX-146, DENACOL EX-121, DENACOL EX-141, DENACOL EX-145, DENACOL EX-147, DENACOL EX-192, DENACOL EX-731 (all manufactured by Nagase ChemteX Corporation), YL9028 (manufactured by Mitsubishi Chemical Corporation), OCR-EP, NPG(D), DY-BP, DY-BP, and HD(D) (all manufactured by Yokkaichi Chemical Co., Ltd.).

The glycidylamine type epoxy monomer has an amine structure.

As the glycidylamine type epoxy monomer, an appropriately synthesized glycidylamine type epoxy monomer may be used, or a commercially available glycidylamine type epoxy monomer may be used.

Examples of the commercially available glycidylamine type epoxy monomer include, but are not limited to, TETRAD-X (manufactured by Mitsubishi Gas Chemical Company, Inc.) and VH-523 (manufactured by NIPPON STEEL Chemical & Material Co., Ltd.).

——(Meth)Acrylate Monomer——

The (meth)acrylate monomer is not particularly limited and may be appropriately selected from general photopolymerization type (meth)acrylate monomers according to the purpose. Each of these may be used alone or in combination with others.

As the (meth)acrylate monomer, an appropriately synthesized (meth)acrylate monomer may be used, or a commercially available (meth)acrylate monomer may be used. Examples of the commercially available (meth)acrylate monomer include, but are not limited to, AOMA (registered trademark) (manufactured by Nippon Shokubai Co., Ltd.), HEA (hydroxyethyl acrylate), HPA (hydroxypropyl acrylate), 4-HBA (4-hydroxybutyl acrylate), AIB (isobutyl acrylate), TBA (t-butyl acrylate), NOAA (n-octyl acrylate), INAA (isononyl acrylate), VISCOAT #197 (nonyl acrylate), IDAA (nonyl acrylate), LA (lauryl acrylate), STA (stearyl acrylate), ISTA (isostearyl acrylate), IBXA (isobornyl acrylate). VISCOAT #155 (cyclohexyl acrylate), VISCOAT #196 (3,3,5-trimethylcyclohexyl acrylate), VISCOAT #160 (benzyl acrylate), VISCOAT #192 (phenoxyethyl acrylate), VISCOAT #150 (tetrahydrofurfuryl acrylate), VISCOAT #190 (ethyl carbitol acrylate), 2-MTA (methoxyethyl acrylate), VISCOAT #MTG (methoxytriethylene glycol acrylate), MPE400A (methoxy polyethylene glycol acrylate), MPE550A (methoxy polyethylene glycol acrylate), OXE-10 ((3-ethyloxetane-3-yl)methyl acrylate), OXE-30 ((3-ethyloxetane-3-yl)methyl methacrylate), MEDOL-10 ((3-ethyloxetan-3-yl)methyl acrylate), VISCOAT #200 (cyclic trimethylolpropane formal acrylate) (all manufactured by Osaka Organic Chemical Industry Ltd.), A-LEN-10 (ethoxylated-o-phenylphenol acrylate), AM-90G (ethoxylated-o-phenylphenol acrylate), AM-130G (ethoxylated-o-phenylphenol acrylate), AMP-20GY (ethoxylated-o-phenylphenol acrylate), A-SA (2-acryloyloxyethyl succinic acid), 701A (2-hydroxy-3-methacrylpropyl acrylate), A-200 (polyethylene glycol #200 diacrylate), A-400 (polyethylene glycol #400 diacrylate), A-600 (polyethylene glycol #600 diacrylate), A-100 (polyethylene glycol #100 diacrylate), ABE-300 (ethoxylated bisphenol A diacrylate), A-BPE-10 (ethoxylated bisphenol A diacrylate), A-BPE-20 (ethoxylated bisphenol A diacrylate), A-BPE-4 (ethoxylated bisphenol A diacrylate), A-DCP (tricyclodecane dimethanol diacrylate), A-DOD-N (1,10-decanediol diacrylate), A-HD-N (1,6-hexanediol diacrylate), A-NOD-N (1,6-hexanediol diacrylate), APG-200 (tripropylene glycol diacrylate), APG-400 (polypropylene glycol #400 diacrylate), APG-700 (polypropylene glycol #700 diacrylate), A-PTMG-65 (polytetramethylene glycol #650 diacrylate), A-9300 (polytetramethylene glycol #650 diacrylate), A-GLY-9E (ethoxylated glycerin triacrylate), A-GLY-20E (ethoxylated glycerin triacrylate), A-TMM-3 (pentaerythritol tri- and tetraacrylate), A-TMM-3L (pentaerythritol tri- and tetraacrylate), A-TMPT (trimethylolpropane triacrylate), AD-TMP (ditrimethylolpropane tetraacrylate), ATM-35E (ethoxylated pentaerythritol tetraacrylate), A-TMMT (pentaerythritol tetraacrylate), A-9550 (dipentaerythritol polyacrylate), A-DPH (dipentaerythritol polyacrylate) (all manufactured by Shin-Nakamura Chemical Co., Ltd.), SR440 (isooctyl acrylate), SR849D (tridecyl acrylate), and SR395 (isodecyl acrylate) (all manufactured by TOMOE Engineering Co., Ltd.).

——Oxetane Monomer——

The oxetane monomer is not particularly limited and may be appropriately selected according to the purpose. Examples thereof include, but are not limited to, compounds represented by any one of Structural Formulas 25 to 33 below. Each of these may be used alone or in combination with others.

[Chem. 3]

Structural Formula 25

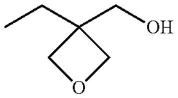

Structural Formula 26

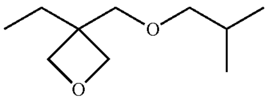

Structural Formula 27

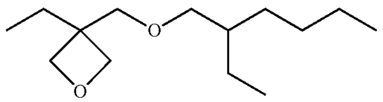

Structural Formula 28

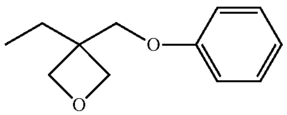

Structural Formula 29

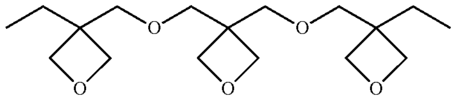

Structural Formula 30

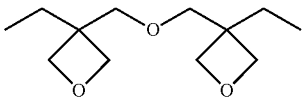

Structural Formula 31

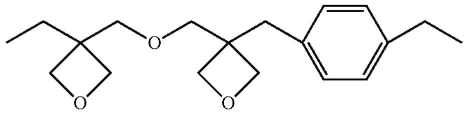

Structural Formula 32

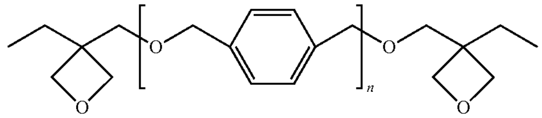

Structural Formula 33

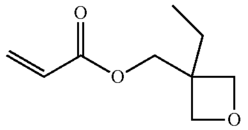

(where in Structural Formula 32, n represents an integer of 1 or 2)

As the oxetane monomer, an appropriately synthesized oxetane monomer may be used, or a commercially available oxetane monomer may be used. Examples of the commercially available oxetane monomers include, but are not limited to, ARON OXETANE OXT101, ARON OXETANE OXT212, ARON OXETANE OXT121, ARON OXETANE OXT221 (all manufactured by Toagosei Co., Ltd.), ETERNACOLL (registered trademark) HBOX, ETERNACOLL (registered trademark) OXBP, and ETERNACOLL (registered trademark) OXIPA (all manufactured by UBE Corporation).

——Urethane Monomer——

The urethane monomer is not particularly limited and may be appropriately selected from general urethane monomers according to the purpose. Each of these may be used alone or in combination with others.

As the urethane monomer, an appropriately synthesized urethane monomer may be used, or a commercially available urethane monomer may be used. Examples of the commercially available urethane monomers include, but are not limited to, US3003, US3003M, US3007, US3007M, and US3123M (all manufactured by Kyoeisha Chemical Co., Ltd.).

——Silicone Monomer——

The silicone monomer is not particularly limited and may be appropriately selected from general silicone monomers according to the purpose. Examples thereof include, but are not limited to, silicone compounds having a reactive group at one end or both ends of polydimethylsiloxane. Each of these may be used alone or in combination with others.

As the silicone monomer, an appropriately synthesized silicone monomer may be used, or a commercially available silicone monomer may be used. Examples of the commercially available silicone monomers include, but are not limited to, SILAPLAINE (registered trademark) FM-3311, SILAPLAINE (registered trademark) FM-3321, SILAPLAINE (registered trademark) FM-3325 (all manufactured by JNC Corporation.), STP-103-UV, and STP-104-UV (both manufactured by Shin-Etsu Chemical Co., Ltd.).

The ink for forming the support portion preferably contains an epoxy monomer as described above. The content of the epoxy monomer in the ink for forming the support portion is not particularly limited and may be appropriately selected according to the purpose, but is preferably 40 mass % or more and more preferably 50 mass % or more, with respect to the total mass of the ink for forming the support portion. The content of the epoxy monomer is preferably 40 mass % or more in view of small curing shrinkage and excellent heat resistance.

In a case where the monomer component in the ink for forming the support portion is a mixture of the epoxy monomer and a monomer component other than the epoxy monomer, the content of the monomer other than the epoxy monomer is not particularly limited and may be appropriately selected according to the purpose, but is preferably from 5 mass % or more to 90 mass % or less, and more preferably from 5 mass % or more to 70 mass % or less, with respect to the epoxy monomer. As the monomer component other than the epoxy monomer, an oxetane compound is preferable in view of excellent compatibility with the epoxy monomer and low viscosity.

——Polymerization Initiator——

The polymerization initiator is not particularly limited and may be appropriately selected from known polymerization initiators. Examples thereof include, but are not limited to, a photo-cationic polymerization initiator, a photo-radical polymerization initiator, and a thermal polymerization initiator. Each of these may be used alone or in combination with others.

——Photo-Cationic Polymerization Initiator——

The photo-cationic polymerization initiator is not particularly limited and may be appropriately selected according to the purpose. Examples thereof include, but are not limited to, a photo-acid generator such as an onium salt having a sulfonium ion or an iodonium ion as a cationic part. Among these, a compound having an anionic part with little corrosiveness to metal portions is preferable as the photo-cationic polymerization initiator.

Specific examples of the photo-cationic polymerization initiator include, but are not limited to, a compound containing $B(C_6F_5)_4$ or $PF_3(C_2F_5)_3$ as an anionic part (generated acid).

As the photo-cationic curing initiator, an appropriately synthesized photo-cationic curing initiator may be used, or a commercially available photo-cationic curing initiator may be used. Examples of the commercially available photo-cationic curing initiator include, but are not limited to, CPI (registered trademark)-110P, CPI (registered trademark)-110A, CPI (registered trademark)-210S, CPI (registered trademark)-110B, CPI (registered trademark)-310B, CPI (registered trademark)-410B, CPI (registered trademark)-310FG, and IK-1FG (all manufactured by San-Apro Ltd.).

——Photo-Radical Polymerization Initiator——

The photo-radical polymerization initiator is not particularly limited and may be appropriately selected according to the purpose. Examples thereof include, but are not limited to, a dialkylphenyl compound, an acylphosphine oxide compound, and an oxyphenyl acetic acid ester compound.

As the photo-radical polymerization initiator, an appropriately synthesized photo-radical polymerization initiator may be used, or a commercially available photo-radical polymerization initiator may be used. Examples of the commercially available photo-radical polymerization initiator include, but are not limited to, OMNIRAD 184 (former IRGACURE 184), OMNIRAD 651 (former IRGACURE 651), OMNIRAD 1173 (former IRGACURE 1173), OMNIRAD 2959 (former IRGACURE 2959), OMNIRAD 369 (former IRGACURE 369), OMNIRAD 907 (former IRGACURE 907), OMNIRAD BMS, OMNIRAD DETX, OMNIRAD TPO H (former IRGACURE TPO), OMNIRAD 819 (former IRGACURE 819) (all manufactured by IGM Resins B.V.), IRGACURE OXE01, IRGACURE OXE02, IRGACURE OXE03, and IRGACURE OXE04 (all manufactured by BASF Japan Ltd.).

——Thermal Polymerization Initiator——

The thermal polymerization initiator is not particularly limited and may be appropriately selected according to the purpose. Examples thereof include, but are not limited to, a photo-acid generator such as an onium salt having a sulfonium ion or an iodonium ion as a cationic part.

As the thermal polymerization initiator, an appropriately synthesized thermal polymerization initiator may be used, or a commercially available thermal polymerization initiator may be used. Examples of the commercially available thermal polymerization initiator include, but are not limited to, SAN-AID SI-60L, SAN-AID SI-80L, SAN-AID SI-100L, SAN-AID SI-110, and L-SAN-AID SI-150 (all manufactured by Sanshin Chemical Industry Co., Ltd.), TA-100, TA-100FG, IK-1, IK-1FG (manufactured by San-Apro Ltd.). OMNICAT 250 (former IRGACURE 250), and OMNICAT 270 (former IRGACURE 270) (both manufactured by IGM Resins B.V.).

The content of the polymerization initiator in the ink for forming the support portion is not particularly limited and may be appropriately selected according to the purpose, but is preferably from 0.1 mass % or more to 10 mass % or less, and more preferably from 0.2 mass % or more to 2 mass % or less, with respect to the total mass of the ink for forming the support portion. If the content of the polymerization initiator is from 0.1 mass % or more to 10 mass % or less, the curing reaction can be appropriately completed, and unreacted components are less likely to remain as reactive impurities.

——Other Components——

The other components in the ink for forming the support portion are not particularly limited and may be appropriately selected according to the purpose. Examples thereof include, but are not limited to, inorganic particles, a resin or resin particles, an adhesion improver, and a solvent. Each of these may be used alone or in combination with others.

——Inorganic Particles——

The inorganic particles are added to reduce a linear thermal expansion coefficient of the adhesive portion and improve the film strength. The inorganic particles can also impart thermal and electrical conductivity. The inorganic particles are not particularly limited and may be appropriately selected according to the purpose, and examples thereof include, but are not limited to, a ceramic material and magnetic particles. Examples of the ceramic material include, but are not limited to, silica ($SiO_2$), aluminum oxide ($Al_2O_3$), aluminum nitride (AlN), and boron nitride (BN). The ceramic material has a smaller linear thermal expansion coefficient and a higher softening temperature than the resin material, and thus, it is possible to obtain an effect of reducing the linear thermal expansion coefficient of the adhesive portion and improving the film strength at high temperature. Examples of the magnetic particles include, but are not limited to, iron (Fe), nickel (Ni), and cobalt (Co). The magnetic particles can impart a function of shielding electromagnetic waves. Each of these may be used alone or in combination with others.

As the inorganic particles, appropriately synthesized inorganic particles may be used, or commercially available inorganic particles may be used. Examples of the commercially available inorganic particles include, but are not limited to, AEROSIL (registered trademark), OX50, AEROSIL (registered trademark)
50, AEROSIL (registered trademark)
90G, AEROSIL (registered trademark)
130, AEROSIL (registered trademark)
150, AEROSIL (registered trademark)
200. AEROSIL (registered trademark)
300, AEROSIL (registered trademark)
380, AEROSIL (registered trademark)
RM50, AEROSIL (registered trademark)
R711, AEROSIL (registered trademark)
R7200, AEROXIDE (registered trademark)
P25, AEROXIDE (registered trademark)
P90 AluC (all manufactured by Nippon Aerosil Co., Ltd.), SEAHOSTAR (registered trademark) KE-S10, SEAHOSTAR (registered trademark) S30, and SEAHOSTAR (registered trademark) S50 (all manufactured by Nippon Shokubai Co., Ltd.).

The content of the inorganic particles in the ink for forming the support portion is not particularly limited and may be appropriately selected according to the purpose, but is preferably from 10 mass % or more to 70 mass % or less, and more preferably from 10 mass % or more to 50 mass % or less, with respect to the total mass of the ink for forming the support portion. If the content of the inorganic particles is 10 mass % or more, the effects of linear thermal expansion and film strength can be easily obtained, and if the content of the inorganic particles is 50 mass % or less, the adhesive portion is less likely to be brittle and the ink viscosity is less likely to increase, which is preferable.

——Resin or Resin Particles——

The resin or the resin particles are added to impart flexibility to the adhesive portion and to reduce thermal stress. The resin or the resin particles are not particularly limited and may be appropriately selected according to the purpose, but a material containing a straight-chain polymer having at least one characteristic among low elasticity and flexibility is preferable. Examples thereof include, but are not limited to, a styrene-butadiene-based resin, an acrylonitrile-butadiene resin, a (meth)acrylic-based resin, and an epoxy resin. Each of these may be used alone or in combination with others. In addition, polymer particles having a core-shell type multilayered structure in which a rubber-like polymer is arranged inside an acrylic copolymer may be used as the resin or the resin particles. Among these, the styrene-butadiene-based resin and the acrylic-based resin are preferable as the resin or the resin particles. It is preferable that the resin or the resin particles have a low glass transition temperature (Tg) to reduce thermal stress, and the Tg may be about 30° C. or less, which is nearly equal to room temperature.

Here, the resin or the resin particles having "low elasticity" refer to a material having an elastic modulus of 200 MPa or less, for example. The resin or the resin particles having "flexibility" refer to a material in which the elastic deformation work ratio is 70% or more. The elastic deformation work ratio of the resin and resin particles can be confirmed, for example, by measuring an indentation elasticity modulus with a micro hardness tester (e.g., FISCHERSCOPE (registered trademark) HM2000, manufactured by FISCHER INSTRUMENTS K.K.).

As the resin material having low elasticity, an appropriately synthesized resin material may be used, or a commercially available resin material may be used. Examples of the commercially available resin material having low elasticity include, but are not limited to, ARUFON (registered trademark) US-1000, ARUFON (registered trademark) UH-2000, ARUFON (registered trademark) UC-3000, ARUFON (registered trademark) UG-4000, ARUFON (registered trademark) UF-5000, and ARUFON (registered trademark) US-600.

As the resin particles having low elasticity, appropriately synthesized resin particles may be used, or commercially available resin particles may be used. Examples of the commercially available resin particles having low elasticity include, but are not limited to, KANE ACE (registered trademark) MX-150, KANE ACE (registered trademark) MX-553 (both manufactured by Kaneka Corporation), FINE SPHERE (registered trademark) MG-155, FINE SPHERE (registered trademark) MG-351, FINE SPHERE (registered trademark) MG-451, FINE SPHERE (registered trademark) MG-651, FINE SPHERE (registered trademark) PZP-1003, FINE SPHERE (registered trademark) BGK-001 (all manufactured by Nippon Paint Industrial Coatings Co., Ltd.). METABLEN (registered trademark) C-223A, METABLEN (registered trademark) C-215AC-201A, METABLEN (registered trademark) C-140A, METABLEN (registered trademark) E-860A, METABLEN (registered trademark) E-870A, METABLEN (registered trademark) E-875A, METABLEN (registered trademark) W-300A, METABLEN (registered trademark) W-450A, METABLEN (registered trademark) W-600A, METABLEN (registered trademark) W-377, METABLEN (registered trademark) S-2002, METABLEN (registered trademark) S-2006, METABLEN (registered trademark) S-2501. METABLEN (registered trademark) S-2030, METABLEN (registered trademark) S-2100, METABLEN (registered trademark) S-2200, METABLEN (registered trademark) SRK200A, METABLEN (registered trademark) SX-006, METABLEN (registered trademark) SX-00 (all manufactured by Mitsubishi Chemical Corporation), ZEFIAC F351, STAPHYLOID AC-3355, AC-3816N, AC-3832SD, AC-4030, and AC-3388 (all manufactured by Aica Kogyo Co., Ltd.).

The content of the resin or the resin particles in the ink for forming the support portion is not particularly limited and may be appropriately selected according to the purpose, but is preferably from 1 mass % or more to 50 mass % or less, and more preferably from 3 mass % or more to 20 mass % or less, with respect to the total mass of the ink for forming the support portion. If the content of the resin or the resin particles is 1 mass % or more, thermal stress can be reduced more suitably. If the content of the resin or the resin particles is 50 mass % or less, it is possible to prevent an increase in the viscosity of the ink for forming the support portion, so that the ink can be suitably used for the inkjet method. In addition, a content of 50 mass % or less is less likely to cause bubbles and voids at high temperatures.

——Adhesion Improver——

The adhesion improver is a compound including an organic substance and silicon. It is particularly preferable that the compound includes a silane coupling agent having two or more different types of reactive groups in the molecule, to improve adhesiveness to a contact target (particularly, a semiconductor and a semiconductor substrate).

Commercially available products can be used as the adhesion improver. Specific examples of the adhesion improver include, but are not limited to, DOWSIL Z-6040, DOWSIL Z-6062 (both manufactured by DOW), and KMB-403 (manufactured by Shin-Etsu Chemical Co., Ltd.).

The content of the adhesion improver in the ink for forming the support portion is not particularly limited and may be appropriately selected according to the purpose, but is preferably from 0.1 mass % or more to 20 mass % or less, and more preferably from 0.1 mass % or more to 5 mass % or less, with respect to the total mass of the ink for forming the support portion. If the content of the adhesion improver is 0.1 mass % or more, an adhesion effect can be obtained. The content of the adhesion improver is preferably 20 mass % or less in view of preventing a decrease in ink strength.

——Solvent——

The solvent is not particularly limited and may be appropriately selected according to the purpose. Examples thereof include, but are not limited to, terpineol, 1-methoxy-2-propanol, diethylene glycol monomethyl ether, triethylene glycol monomethyl ether, 2-methoxyethyl acetate, 2-methoxybutyl acetate, and 2-butanone. Each of these may be used alone or in combination with others.

The content of the solvent in the ink for forming the support portion is not particularly limited and may be appropriately selected according to the purpose, but the solvent is preferably not contained when the viscosity of the ink for forming the support portion is appropriate. If the solvent is added, the content of the solvent is preferably from 1 mass % or more to 10 mass % or less, and more preferably from 1 mass % or more to 5 mass % or less, with respect to the total mass of the ink for forming the support portion. If the content of the solvent is 1 mass % or more, it is possible to easily manage the solvent component of the ink for forming the support portion and to lower the viscosity, so that the ink can be suitably used for the inkjet printing method. In addition, a content of 10 mass % or less is less likely to cause bubbles and voids at high temperatures.

Among these, the ink for forming the support portion preferably has a photocurable composition, and preferably contain the epoxy-based monomer, a (meth)acrylate monomer, and the photo-cationic polymerization initiator or the photo-radical polymerization initiator, if it is difficult to apply the adhesion process by heat curing after light curing, it is preferable to form a support portion having a tackiness property by light curing. It is preferable for the ink for forming the support portion having a tackiness property to contain a (meth)acrylate monomer and the photo-radical polymerization initiator. In particular, it is easy to impart a tackiness property by using a monofunctional material as a (meth)acrylate monomer. Examples of preferred monofunctional acrylic monomers include, but are not limited to, SR440 (isooctyl acrylate), SR849D (tridecyl acrylate), and SR395 (isodecyl acrylate).

A commercially available photo-curable and/or heat-curable inkjet solder resist ink and other inks may also be used as the ink for forming the support portion. Examples of the commercially available inks include, but are not limited to, IJSR4000, IJSR9000 (both manufactured by TAIYO INK MFG. CO., LTD.), PR1205, PR1243, PR1258, (all manufactured by GOO Chemical Co., Ltd.), SUN-004, SUN-013A, SUN-015, C-202, C-400, E635A, E800D (all manufactured by Sekisui Chemical Co., Ltd.), and jSVR (manufactured by Dexerials Corporation).

<Bonding Portion>

The bonding portion 5 is a part of the conductive portion 2 described above, and a unique function of the bonding portion 5 will be described below. Forming the bonding portion 5 allows heat from the heat-generating component to be diffused in a planar direction of the conductive layer. The bonding portion formed at the interface with the heat-generating component 30 and/or the cooling component 20 makes it possible to enlarge a contact area to reduce contact resistance. The same is true for the electrically conductive layer, and it is possible to reduce electrical resistance. In particular, the contact resistance at end surfaces can be reduced by making the average of areas of the conductive portions positioned on an upper end surface and a lower end surface larger than a cross-sectional area of the conductive portions at a central portion of the conductive layer.

Since the bonding portion 5 is part of the conductive portion 2, the material that forms the bonding portion 5 is the same as the material listed for the conductive portion 2. It is also possible to use a different material only at the bonding portion 5. When the conductive portion (including bonding portion) is located at an end portion of the conductive layer, the contact resistance at the interface is reduced and the conductivity is improved. This has a similar effect on the heat-generating component (top component) and the cooling component (bottom component).

By using the same or similar materials to form the bonding portion and the conductive portion, the thermal contact resistance between the bonding portion and the portion other than the bonding portion in the conductive portion 2 can be reduced. It is preferable to form the bonding portion in the conductive portion 2 with a metal nanoparticle layer and perform sintering treatment thereon, so that the bonding portion and the portion other than the bonding portion can be bonded with low thermal contact resistance.

Although the bonding portion 5 can be formed inside the conductive layer 10, the bonding portion 5 is preferably formed on a front surface or a back surface of the conductive layer. When the bonding portion is formed on the front surface and/or the back surface, it is possible to obtain an effect of lowering the interfacial thermal resistance with the heat-generating component and/or the cooling component. In the present embodiment, the similar material means Ag, Cu. Au, Al, or a mixture of these materials in the case of metal materials.

<Patterning of Conductive Layer>

The conductive portion 2 (including bonding portion 5) is preferably formed in an area of 10% or more to 80% or less of the surface of the conductive layer. If the formation area is larger than 10%, it is easier to obtain the effect of lowering the interfacial thermal resistance with the heat-generating component and/or the cooling component. If the formation area is smaller than 80%, it is easier to obtain mechanical adhesive strength at the interface with the heat-generating component and/or the cooling component. As suitable conditions, the conductive portion (including bonding portion 5) is arranged in a circle centered around a location where heat is generated, and a surrounding region of about 50% in terms of area is designed to be occupied by the support portion 1, to ensure adhesive strength. However, this ratio can be reduced to about 40%, for example, by appropriately arranging the support portion 1 in several locations inside the circular portion of the heat generating area to increase the adhesive strength corresponding to thermal expansion. As a result, the conductive portion occupies 60% and thus, the heat conduction efficiency can be improved. These conditions are determined by many conditions such as the amount of heat generated by an IC chip, and the cooling capacity of a heat sink of the cooling component. Optimum design can be performed under each condition.

The pattern formation of the conductive portion 2 (including bonding portion 5) can be appropriately adjusted to maximize the heat radiation effect, and various patterns can be set such as a dotted pattern, a line pattern, a ring-shaped pattern, and a radial pattern as illustrated in FIGS. 8A, 8B, 8C, and 8D, which are plan views of the conductive layer 10, and FIGS. 7A, 7B, 7C, 7D, 7E, 7F, 7G, and 7H, which are cross-sectional views of the conductive layer 10.

In particular, if there is a heat distribution in the heat-generating component 30, it is preferable to form the conductive portion 2 (including bonding portion 5) in a portion corresponding to a portion that generates a large amount of heat. It is also effective to change the cross-sectional thickness of the conductive portion 2.

Figures 7A, 7B, 7C, 7D, 7E, 7F:
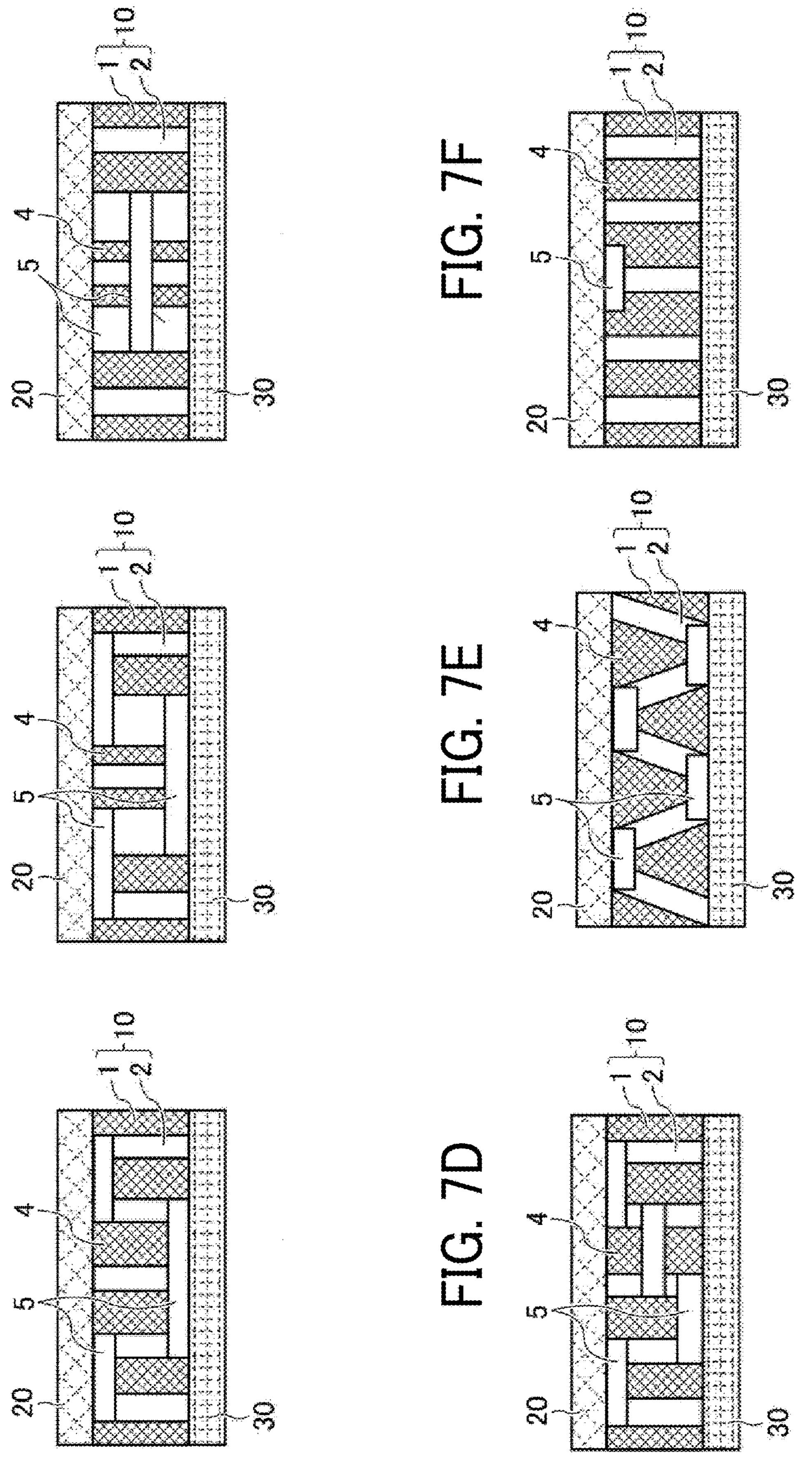
FIGS. 7A to 7H are cross-sectional views for explaining a modification of the conductive layer of the present embodiment.

FIG. 7A illustrates a first modification of the conductive layer 10, which differs from the conductive layer of the present embodiment in FIG. 5 in that the conductive portion 2 including the bonding portion 5 is formed on front and back surfaces (the interface with the heat-generating component 30 and the contact surface with the cooling component 20) of the conductive layer. By forming the bonding portion 5 that secures the contact area at the front and back interfaces of the conductive layer 10, the contact resistance can be further reduced.

FIG. 7B illustrates a second modification of the conductive layer 10, which differs from the conductive layer of the present embodiment in FIG. 5 in that a plurality of conductive portions 2 having different thickness are formed. The thickness of the conductive portion 2 affects thermal or electrical conductivity. As an example, in a case of a light-emitting component such as an LED, for which a position where the heat is generated can be predicted in advance, efficient heat conduction can be achieved by arranging a thick conductive portion at the position. As another example, even in the electrical conduction of high-frequency ICs, if simulations are used to optimize, on the basis of the high-frequency characteristics of the impedance of the IC, an appropriate conductivity, that is, a thickness of the conductive portion, and a parasitic capacitance and the like is considered, it is possible to achieve high electrical conductivity.

FIG. 7C illustrates a third modification of the conductive layer 10, which differs from the conductive layer of the present embodiment in FIG. 5 and the second modification in that the bonding portion 5 is formed inside (in a film of) the conductive layer 10. The bonding portion 5 has high conductivity in a horizontal direction, and thus, it is possible to design a bypass shape that transfers a large amount of heat from a center of heat generation to a location having high cooling efficiency. This is also suitable for simply diffusing heat widely from the center of heat generation. At the same time, it is also possible to arrange the filling portion 4 at an appropriate location to optimize the fixing of the cooling component 20.

FIG. 7D illustrates a fourth modification of the conductive layer 10, which differs from the first modification of the conductive layer in that the bonding portion 5 is also formed on front and back surfaces of the conductive layer 10 and inside (in a film of) the conductive layer. If the heat distribution is localized, such as in a case of a Peltier element among the cooling components, there is also distribution in thermal expansion or thermal contraction. Therefore, the thermal distribution is simulated in advance to arrange the filling portion 4 and the support portion 1 at appropriate positions. In this design, if the bonding portion 5 that conducts heat in a bypass manner can be arranged inside the conductive layer, the degree of freedom in design increases, and an optimum layer structure can be formed. In particular, in a case of an IC or LED having a localized heat generating portion, or a Peltier element having a localized cooling portion, it is effective to perform optimization by forming and combining the bonding portion 5 on front and back surfaces of the conductive layer and inside (in a film of) the conductive layer.

FIG. 7E illustrates a fifth modification of the conductive layer 10, which differs from the conductive layer of the present embodiment in that a conductive portion having an inclination in a thickness direction of the conductive layer 10 is formed, and the bonding portion 5 is formed in a part between adjacent conductive portions (both front and back surface portions of the conductive layer). When a side surface of the support portion 1 is tapered, the force from the conductive portion 2, the filling portion 4, and other upper members toward the surface of the base material is applied to the side surface having an inclined surface in a projection vector manner, and thus, separation of the conductive portion is prevented and the fixing force increases.

FIG. 7F is the sixth modification of the conductive layer, which differs from the conductive layer of the present embodiment in FIG. 5 in that bonding is not formed and the contact area of the thermally conductive layer at the interface with the cooling component 20 is large. Even in a configuration where a plurality of conductive portions are not coupled, the same effect can be obtained by increasing the contact area of the thermally conductive layer at the interface by means of the horizontal bonding portion 5. In particular, if the conductive portion is formed as a highly conductive portion by sintering metal nanoparticles, even without the bonding portion, it is possible to provide a conductive layer having lower thermal resistance and more excellent heat radiation performance than a conventional conductive layer, by improving thermal conductivity in the thickness direction, improving thermal resistance at the contact surface, and forming a thin film structure, which are caused by increasing the contact area of the thermally conductive layer at the interface. As illustrated in FIG. 7F, the ability to spread the conductive portion 2 arbitrarily in the planar direction is a feature of the inkjet coating method, and is one of the forms that can be formed uniquely. The support portion 1 is placed on the bottom surface and the side surface of the conductive portion 2, and is adhered to the conductive portion to prevent the conductive portion from peeling off.

Figure 7G:
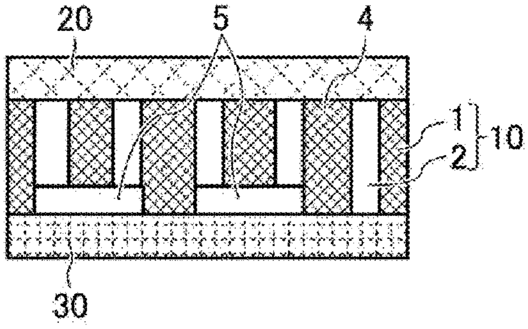

FIG. 7G is a seventh modification of the conductive layer, which differs from the conductive layer of the present embodiment in FIG. 5 in that the bonding portion 5 is formed only at the interface with the heat-generating component 30 (bottom component). The same effect as in the present embodiment can be obtained by increasing the contact area of the thermally conductive layer at the interface with the bottom component.

Figure 7H:
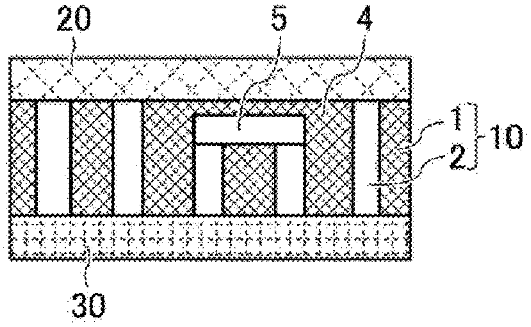
Figure 8A:
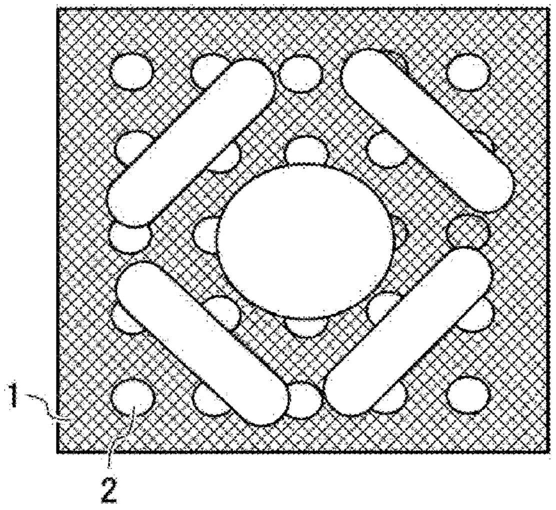
FIGS. 8A to 8D are plan views for explaining a modification of the conductive layer of the present embodiment.
Figure 8B:
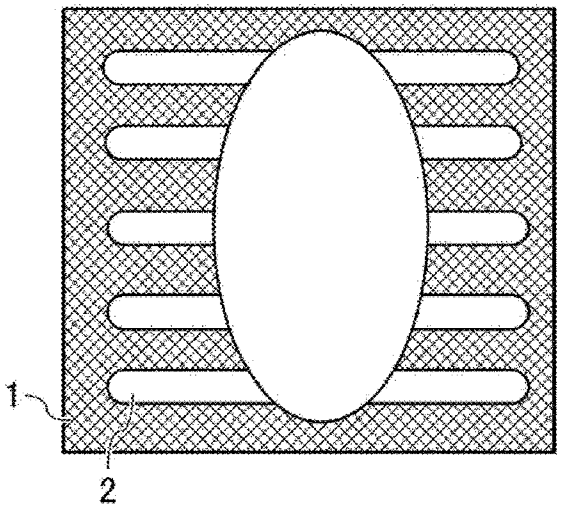
Figure 8C:
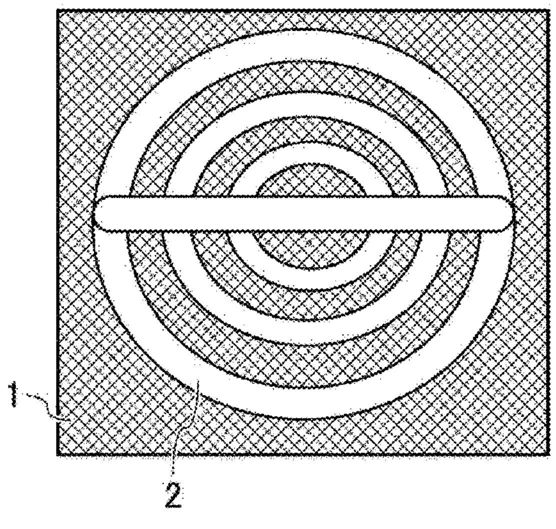
Figure 8D:
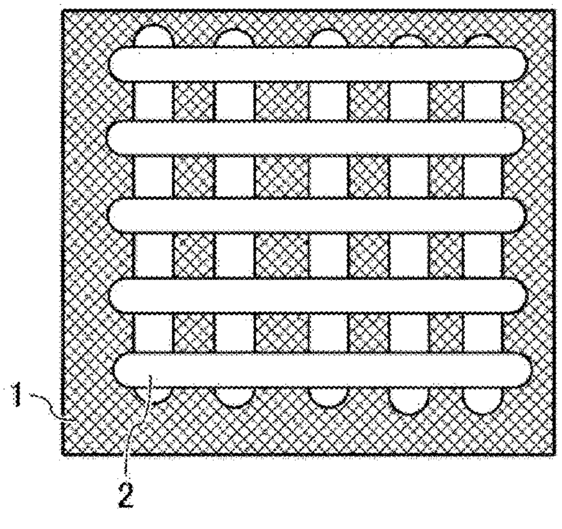

FIG. 7H is an eighth modification of the conductive layer, which differs from the conductive layer of the present embodiment in FIG. 5 in that the filling portion 4 is formed between the bonding portion 5, which is the conductive portion 2, and the cooling component 20 (top component). Since the filling portion 4 is formed between the bonding portion 5 and the cooling component 20 (top component), the adhesive strength with the cooling component 20 (top component) can be further enhanced.

In the eighth modification, it is preferable to contain conductive inorganic filler in the material of the support portion 1 (filling portion 4) in order to obtain conductivity even in the portion where the filling portion 4 is formed between the bonding portion 5 and the cooling component 20 (top component). Between the bonding portion 5 and the cooling component 20 (top component), the formed filling portion 4 preferably has a thickness of 10 μm or less. When the thickness is 10 μm or less, conductivity can be increased.

The film thickness of the bonding portion 5 can be appropriately adjusted to maximize the conductive effect, but is preferably ⅓ or less of that of the conductive layer and in a range from 0.05 μm to 50 μm, both inclusive. This is because if the thickness is thicker than 0.05 μm, the conductive effect of the bonding portion 5 is large, and if the thickness is thinner than 50 μm, the productivity of pattern formation is easily improved.

EXAMPLES

In the following, a manufacturing method for the present example explained above will be described in Examples 1 and 2.

Example 1

—Ink—

As the ink for forming the conductive portion, Ag nanoparticle ink (Sicrys 150™-119) (PVnanocell) with Ag nanoparticle content of 50 wt % and average particle diameter of 70 nm was prepared. As the ink for forming the support portion, the ink was prepared by mixing and stirring 36 parts of alicyclic epoxy monomer (EPOCHALIC THIDE, manufactured by ENEOS Corporation), 12 parts of glycidylamine type tetrafunctional epoxy monomer TETRAD-X (manufactured by Mitsubishi Gas Chemical Company, Inc.), 32 parts of oxetane monomer (ARON OXETANE OXT-221, manufactured by Toagosei Co., Ltd.), 19 parts of oxetane acrylic monomer (OXE-10, manufactured by Osaka Organic Chemical Industry Ltd.), 2 parts of polyfunctional dipentaerythritol polyacrylic monomer (A-DPH, manufactured by Shin-Nakamura Chemical Co., Ltd.), 0.1 parts of photopolymerization initiator (IRGACURE TPO, manufactured by IGM Resins B.V.), and 0.8 parts of thermal polymerization initiator (SAN-AID SI-150L, manufactured by Sanshin Chemical Industry Co., Ltd.).

—Pattern Design—

A glass (first glass) having a square shape with a side of 40 mm and a thickness of 1 mm was prepared. As illustrated in FIG. 5, a pattern was designed, which has 5×5 conductive portions each having a diameter of 2 mm at the center of the glass, a bonding portions each having a diameter of 8 mm, and a support portion having a square shape, excluding the conductive portion, with a side of 22 mm at the center of the glass.

—Formation of Support Portion and Conductive Portion—

Temporary curing patterning was performed by using a 365 nm LED array to UV-cure landing droplets of the ink for forming the support portion, which is discharged from an inkjet head (MH5420 Ricoh Co., Ltd.), at the support portion forming area on the surface of the first glass. Next, the ink for forming the conductive portion was discharged by inkjet onto the conductive portion, and the droplets were dried at 120° C. for 10 minutes to form the conductive portion and the bonding portion to produce the conductive layer of the present embodiment. The thickness of the conductive layer was 20 μm.

—Sticking—

A glass (second glass) having a square shape with a side of 22 mm and a thickness of 0.4 mm was superimposed and stuck to the surface of the formed conductive layer, and annealed at 150° C. for 2 hours to prepare a stuck sample of the present embodiment (FIG. 5), in which two glass substrates were fabricated as the cooling component 20 and the heat-generating component 30.

Figure 9:
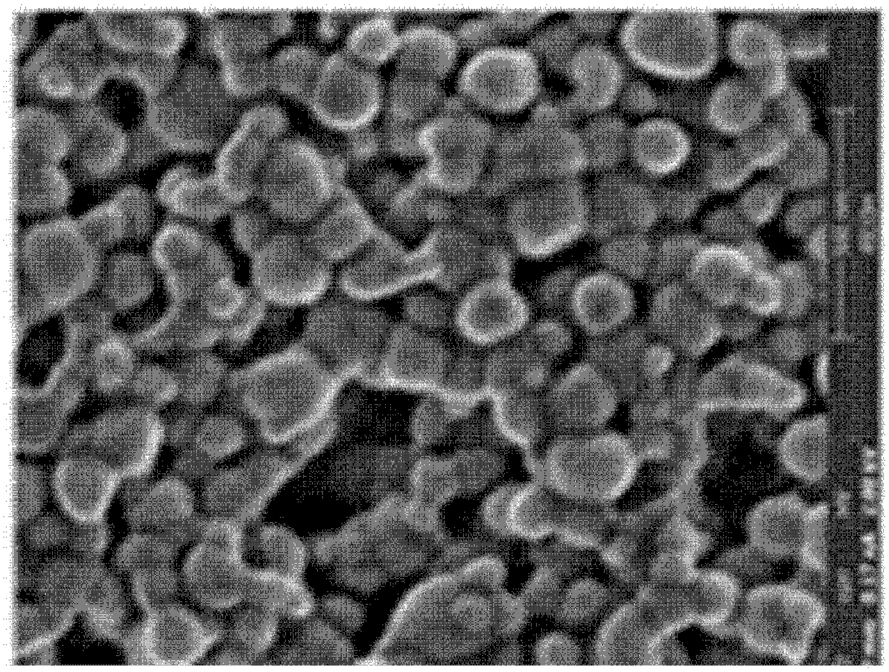
FIG. 9 is a micrograph of the present embodiment.

The ink for forming the conductive portion was used to form, under the same conditions (dried at 120° C. for 10 minutes and annealed at 150° C. for 2 hour), a conductive portion having a thickness of 20 μm in a region having a square shape with a side of 22 mm in the glass having a square shape with a side of 40 mm and a thickness of 1 mm. The volume resistivity of the obtained conductive portion was measured as $1.0\times10^{-5}$ Ω*cm. The fact that nanoparticles were bonded to each other, that is, sintered, was confirmed by SEM observation (FIG. 9). The surface roughness was 30 nm or less.

The film thickness and the surface roughness were measured by (ALPHA-STEP D-500, manufactured by KLA-Tenchore Corporation). The resistance value was measured by a 4-terminal resistance measuring machine (LORESTA-GP, manufactured by Mitsubishi Chemical Analytech Co., Ltd.). A state of the contact between the front and back glass surfaces and the conductive layer 10 was visually observed, and it was confirmed that the bonding portion 5, the conductive portion 2, and the resin portion were in good contact with the front and back glass surfaces.

Example 2

A conductive layer of Example 2 was manufactured similarly to Example 1, except that an Ag nanoparticle ink Smart Jet 1 (Genesink) was used as the ink for forming the conductive portion.

Figure 10:
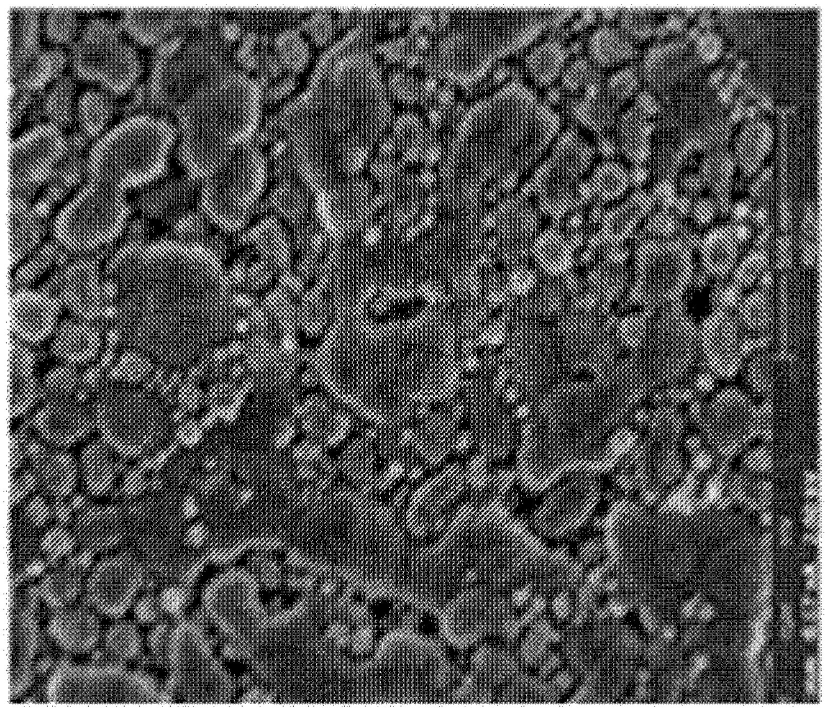
FIG. 10 is a micrograph of the present embodiment.

The volume resistivity was $1.4\times10^{-5}$ Ω*cm. The fact that nanoparticles were bonded to each other, that is, sintered, was confirmed by SEM observation (FIG. 10). The surface roughness was 30 nm or less. A state of the contact between the front and back glass surfaces and the conductive layer was visually observed, and it was confirmed that the bonding portion 5, the conductive portion 2, and the resin portion, which is the non-conductive portion 1, were in good contact with the front and back glass surfaces.

Figure 11:
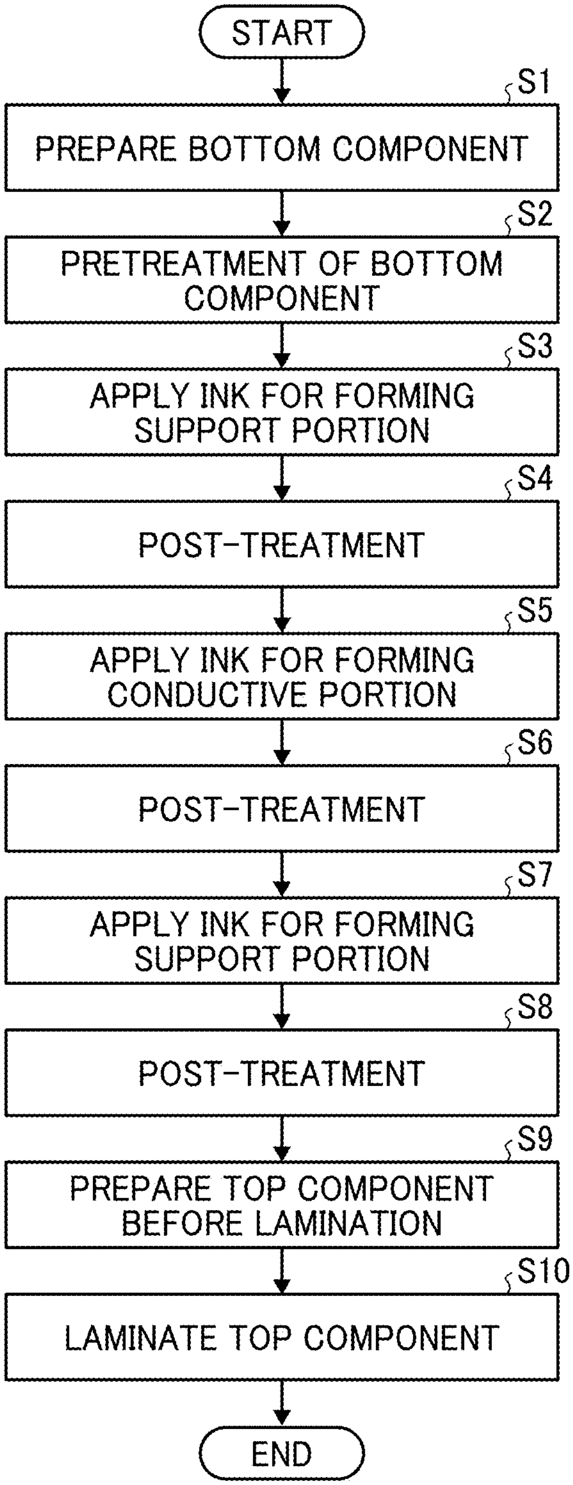
FIG. 11 is a flowchart for explaining a manufacturing method for the present embodiment.

FIG. 11 is a flowchart for explaining a manufacturing method for an element using the conductive layer of the present embodiment. Specifically, the manufacturing method corresponds to a manufacturing method for the conductive layer of FIG. 7E. The explanation proceeds in the order of steps.

(Step 1) A component (bottom component) on which a conductive layer is directly formed is prepared.

(Step 2) Before a material application step, pretreatment is performed as desired. Examples of the pretreatment include, but are not limited to, a cleaning treatment, a surface reforming treatment, a surface modification treatment, and a heat treatment.

(Step 3) Ink for forming a support portion is applied to the bottom component to form a pattern. An inkjet method is used.

(Step 4) Post-treatment is performed. The post-treatment is performed to convert the applied material. The post-treatment includes, but is not limited to, application of light or heat energy. The post-treatment may be performed simultaneously with step 3, or may be performed later. The conversion of the material includes, but is not limited to, evaporation of a solvent and a chemical reaction. The material is converted to avoid trouble in the next step. Step 3 and step 4 may be performed a plurality of times as a series of steps.

(Step 5) Ink for forming a conductive portion is applied to the bottom component and the support portion. The ink for forming the conductive portion may be applied to the entire surface of the bottom component and the support portion, or the surface may be patterned. An inkjet method is used.

(Step 6) Post-treatment is performed. The post-treatment is performed to convert the applied material. The post-treatment includes, but is not limited to, application of light or heat energy. The post-treatment may be performed simultaneously with step 5, or may be performed later. The conversion of the material includes, but is not limited to, evaporation of a solvent and a chemical reaction. The material is converted to avoid trouble in the next step. Step 5 and step 6 may be performed a plurality of times as a series of steps.

(Step 7) Ink for forming a support portion is applied to an outermost surface of a structure formed by the support portion and the conductive portion to form a pattern. An inkjet method is used.

(Step 8) Post-treatment is performed. The post-treatment is performed to convert the applied material. Examples of the post-treatment include, but are not limited to, application of light or heat energy. The post-treatment may be performed simultaneously with step 8, or may be performed later. The conversion of the material includes, but is not limited to, evaporation of a solvent and a chemical reaction. The material is converted to avoid trouble in the next step. Step 7 and step 8 may be performed a plurality of times as a series of steps. Steps 5 to 8 may be performed a plurality of times as a series of steps.

(Step 9) A component (top component) to be installed on the upper surface of the conductive layer is prepared. If desired, the structure formed until step 8 may be subjected to pretreatment.

(Step 10) The conductive layer and the top component are stuck together. Heat or pressure are applied from the outside to make the conductive layer and the top component adhere to each other.

The top component and the bottom component described above correspond to the heat-generating component 30 and the cooling component 20, respectively. Below, these terms will be used for convenience and ease of understanding. In addition, the base material corresponds to the bottom component, and the top component corresponds to the member to be conducted or the other base material.

FIGS. 12A to 12E are cross-sectional views for explaining the manufacturing method for the present embodiment. Specifically, the manufacturing method corresponds to a manufacturing method for the conductive layer of FIG. 7E. FIGS. 13A to 13C illustrate plan views of the manufacturing method. FIGS. 12A to 12E illustrate a part extracted from the process of steps 3 to 10 of FIG. 11 and illustrate cross-sectional views of an element using the conductive layer 10. FIGS. 13A to 13C illustrate top views of FIGS. 12A to 12C. FIG. 13A corresponds to FIG. 12A, FIG. 13B corresponds to FIG. 12B, and FIG. 13C corresponds to FIG. 12C.

Figure 12A:
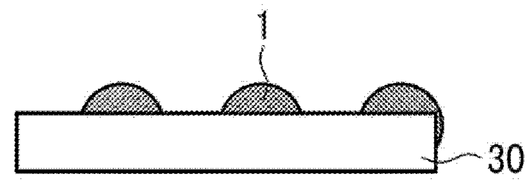
FIGS. 12A to 12E are cross-sectional views for explaining the manufacturing method for the present embodiment.
Figure 13A:
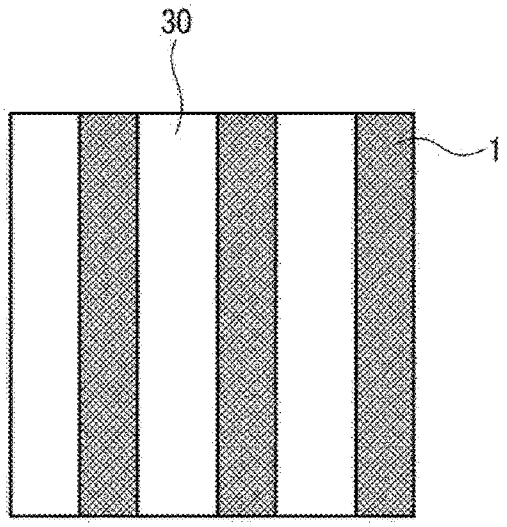
FIGS. 13A to 13C are plan views for explaining the manufacturing method for the present embodiment.
Figure 13B:
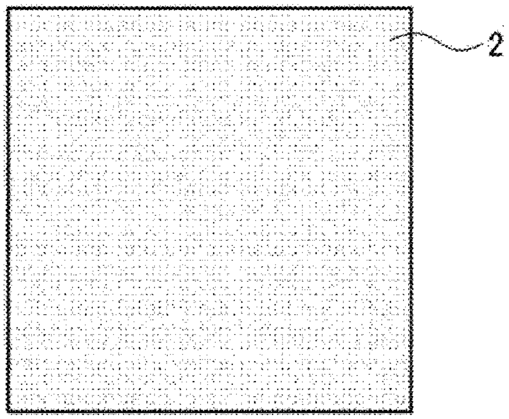
Figure 13C:
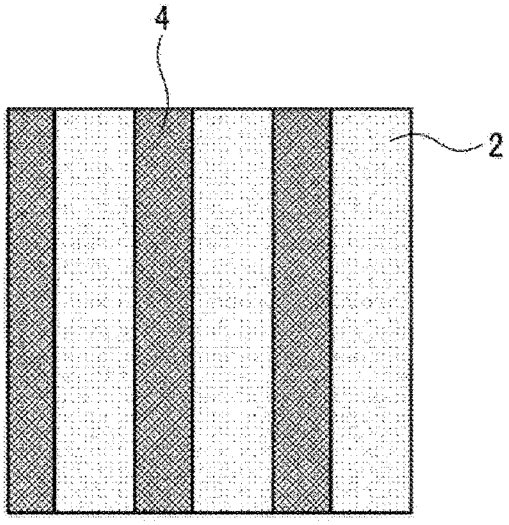

FIG. 12A and FIG. 13A are schematic diagrams illustrating a state after step 4. A structure in which the support portion 1 is formed in a line pattern on the bottom component 30 is illustrated as an example. The support portion is obtained by directly applying a material onto the bottom component and converting the material by a post-treatment. By this step, it is possible to obtain a support portion having strong adhesion to the bottom component.

Figure 12B:
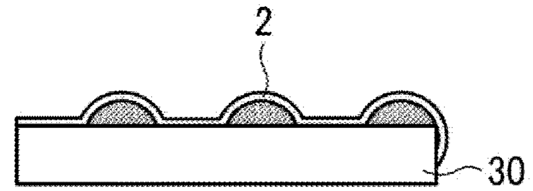

FIG. 12B and FIG. 13B are schematic diagrams illustrating a state after step 6. A structure in which the conductive portion is formed on the entire upper surface of the bottom component 30 and the support portion 1 is illustrated as an example. In this example, the conductive layer is formed along the shape of the patterned support portion. By applying the ink for forming the conductive portion, the conductive portion is disposed on at least one of the upper surface or the lower surface of the non-conductive portion and on a side surface of the non-conductive portion, so that a contact area between the conductive portion and the non-conductive portion is increased and contact therebetween occurs from multiple directions, thereby increasing shearing stress and fixing force. When the conductive portion and the support portion are fixed by a strong and stable fixing force, it is possible to provide a method for manufacturing a conductive layer having higher conductivity.

If a film is formed on the entire surface without forming a pattern, it is possible to simplify a film forming process. If the conductive portion is formed along the shape of the support portion, it is possible to simplify a process of forming a heat conduction path by the conductive portion in the vertical direction from the bottom component. In addition, even if a method for increasing the film thickness of the conductive portion is not selected, it is possible to form a conductive portion whose structure is continuous in the thickness direction of the conductive layer.

The conductive portion is formed along the thickness direction of the support portion 1, and thus, it is suitable if at least a part of a cross section of the pattern of the support portion 1 has a forward tapered shape (pyramid shape). This facilitates film formation without impairing the continuity of the conductive member. In addition, the force from the conductive portion, the filling portion, and other upper members toward the surface of the base material is applied to the side surface having an inclined surface in a projection vector manner, and thus, separation of the conductive portion is prevented and the fixing force increases.

Figure 12C:
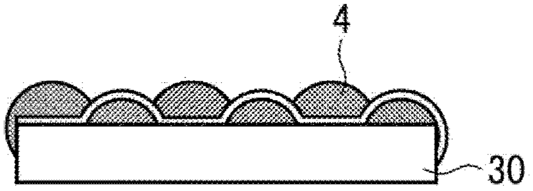

FIG. 12C and FIG. 13C are schematic diagrams illustrating a state after step 8. A structure in which the filling portion 4 is formed in a line pattern at a location that does not overlap with the support portion 1 is illustrated as an example. The conductive portion is sandwiched by the filling portion from an upper portion and a side surface, and thus, the conductive portion is stably fixed without separating from the support portion, resulting in increased fixing force and improved conductivity. If the filling portion 4 and the support portion 1 do not overlap, it is possible to maintain a constant film thickness of the conductive layer on average. The support portion is patterned, and thus, the support portion does not cover the entire surface of the conductive portion, and a conductive contact between the conductive portion and the top component can be secured. Thus, the heat-generating component (bottom component) and the cooling component (top component) are continuously connected by the conductive portion, thereby improving the conductivity of heat conduction and electric conduction. When the filling portion 4 has an adhesion function for the top component, the joining strength with the top component can be increased.

Figure 12D:
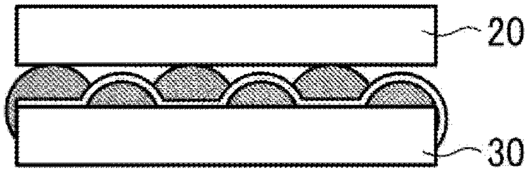
Figure 12E:
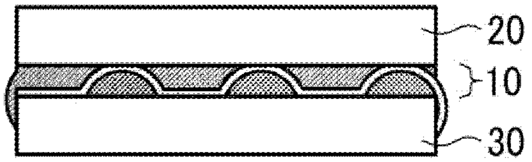

FIGS. 12D and 12E are schematic diagrams illustrating step 9 and step 10. The application of pressure or heat applied to between the bottom component 20 and the bottom component can bring the conductive layer and the top component into close contact. By selecting a material so that the filling portion 4 is sufficiently deformed in an adhesion step and by controlling the state during the process, the adhesion between the conductive layer and the top component can be improved.

In the state illustrated in FIG. 12E, the cross-sectional area ratio between the support portion and the conductive portion can be formed while performing control so that a heat conduction function of the conductive layer is sufficiently high. The present embodiment of FIG. 13 illustrates an example in which the conductive portion is not patterned.

Figure 14A:
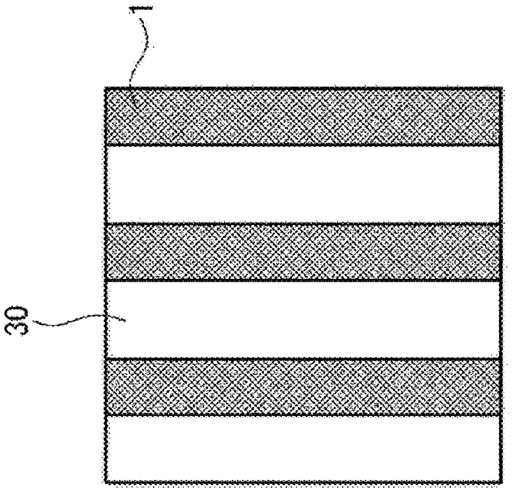
FIGS. 14A to 14C are plan views for explaining a first modification of the manufacturing method for the present embodiment.
Figure 14B:
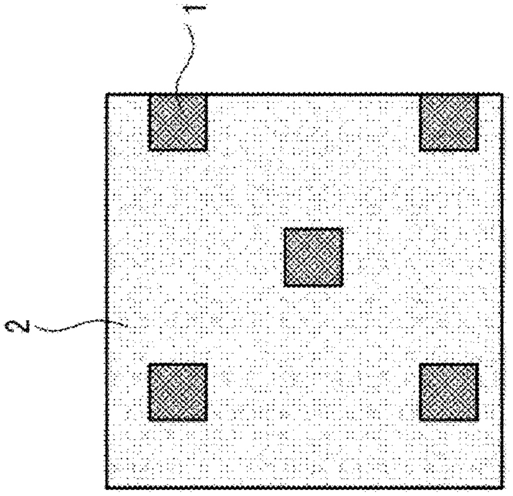
Figure 14C:
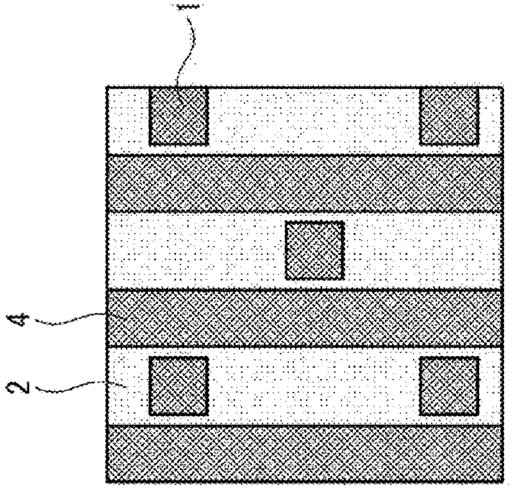

FIGS. 14A to 14C illustrate a ninth modification. In this modification, a part of the support portion 1 is not covered by the conductive portion, and thus, the part of the support portion 1 can contact the top component. This improves the adhesion between the top component and the bottom component.

Figure 15A:
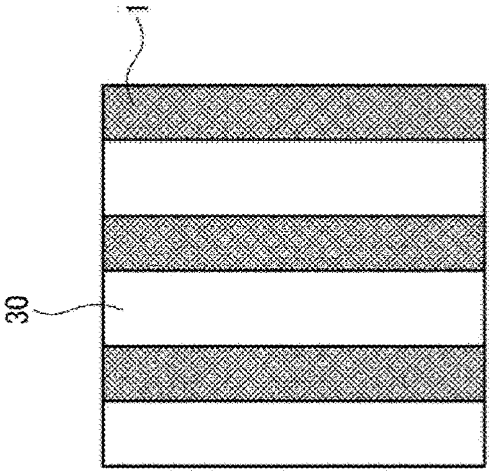
FIGS. 15A to 15C are plan views for explaining a second modification of the manufacturing method for the present embodiment.
Figure 15B:
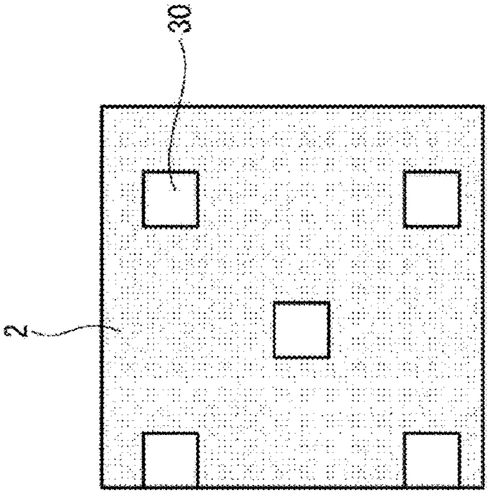
Figure 15C:
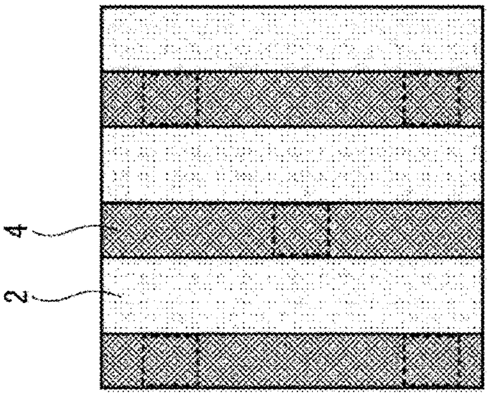

FIGS. 15A to 15C illustrate a tenth modification. In the present modification, a part of the bottom component is not covered by the conductive portion and thus, a part of the support portion 1 (filling portion) can contact the bottom component. Therefore, the support portion and the filling portion are directly formed in each of the top component and the bottom component. This improves the adhesion between the top component and the bottom component.

Figure 16A:
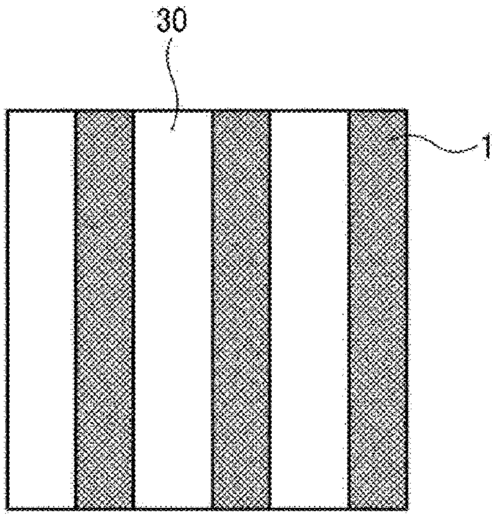
FIGS. 16A to 16C are plan views for explaining a third modification of the manufacturing method for the present embodiment.
Figure 16B:
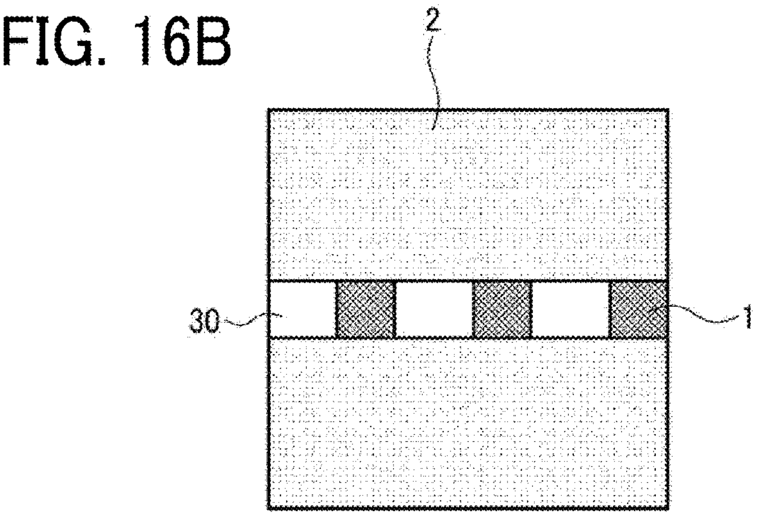
Figure 16C:
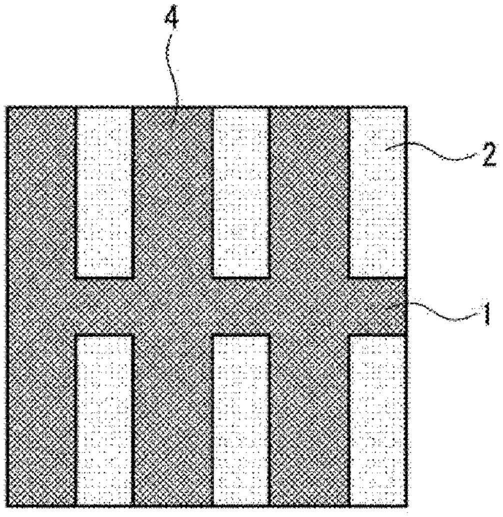

FIGS. 16A to 16C illustrate an eleventh modification. In the present modification, a part of the bottom component and a part of the support portion 1 are not covered by the conductive portion, and thus, the part of the support portion 1 can contact the top component and the part of the support portion 1 (filling portion) can contact the bottom component. This improves the adhesion between the top component and the bottom component. Moreover, the support portion 1 and the filling portion 4 can contact each other. This enhances the film strength of the conductive layer.

Figure 17A:
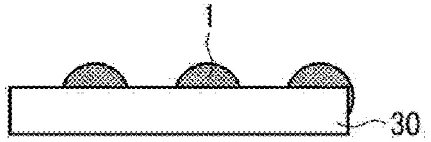
FIGS. 17A to 17G are cross-sectional views for explaining a fourth modification of the manufacturing method for the present embodiment.
Figure 17B:
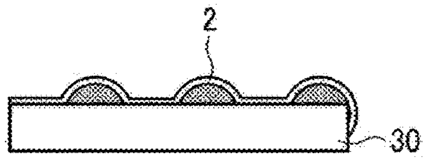
Figure 17C:
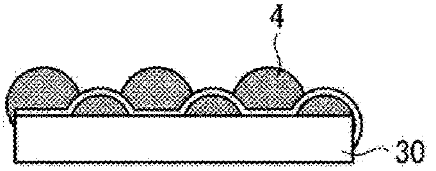
Figure 17D:
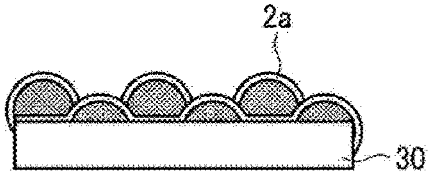
Figure 17E:
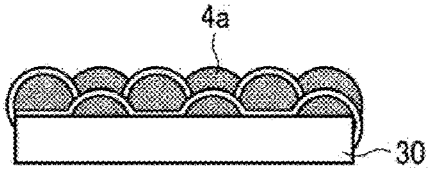
Figure 17F:
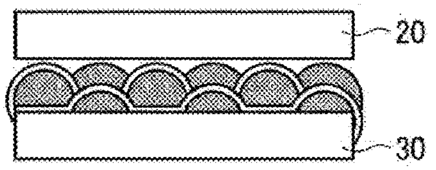
Figure 17G:
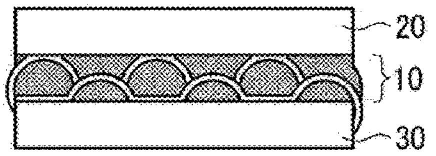
Figure 18A:
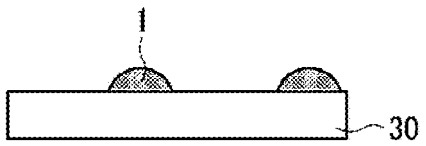
FIGS. 18A to 18G are cross-sectional views for explaining a fifth modification of the manufacturing method for the present embodiment.
Figure 18B:
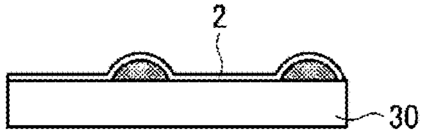
Figure 18C:
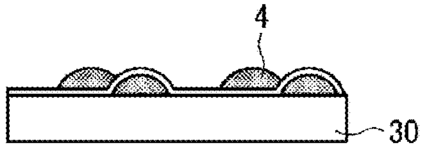
Figure 18D:
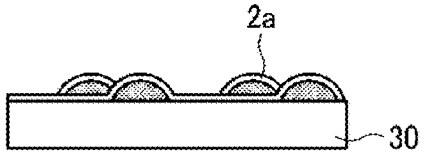
Figure 18E:
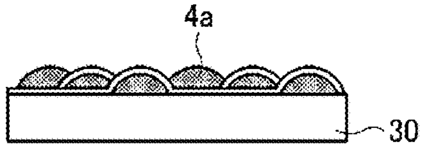
Figure 18F:
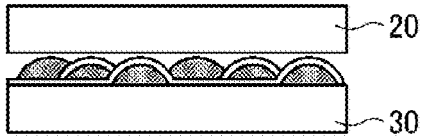
Figure 18G:
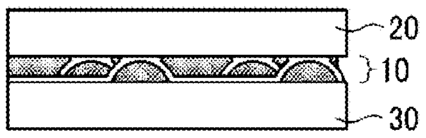
Figure 19A:
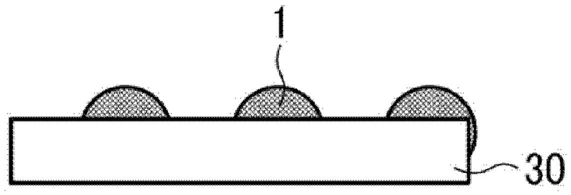
FIGS. 19A to 19E are cross-sectional views for explaining a sixth modification of the manufacturing method for the present embodiment.
Figure 19B:
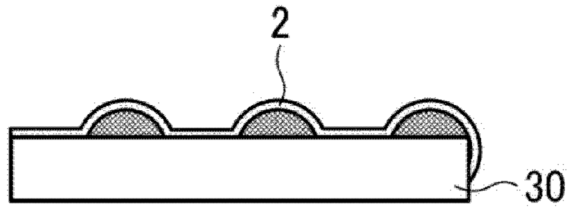
Figure 19C:
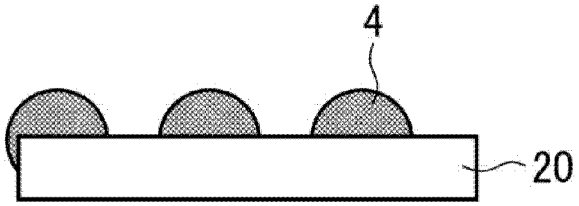
Figure 19D:
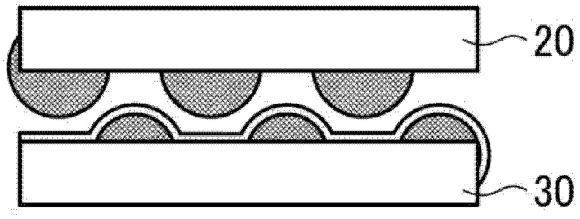
Figure 19E:
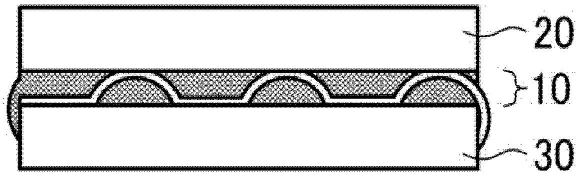

FIGS. 17A to 17G illustrate a twelfth modification. FIGS. 17A to 17C are similar to FIGS. 12A to 12C. FIG. 17D illustrates a state after step 5 and step 6 are performed again. FIG. 17E illustrates that step 7 and step 8 are performed again. Thus, step 5 to step 8 can be performed a plurality of times as a series of steps.

FIGS. 18A to 18G illustrate a thirteenth modification. Using the inkjet method, the conductive portion and the support portion can be manufactured in any pattern. If there is a temperature distribution of the generated heat in the heat-generating component, it is desirable to form a region where many conductive portions are arranged to enhance the heat conduction function. In particular, contact resistance can be reduced by increasing the contact area between the bottom component and the conductive layer.

FIGS. 19A to 19E illustrate a fourteenth modification. In the present modification, the support portion 1 and the conductive portion 2 are formed on the heat-generating component (bottom component) 30, the support portion 1 is formed on the cooling component (top component) 20, and an element is manufactured by joining the obtained components. Thus, the adhesion of the top component and the bottom component can be improved. The member to be conducted described in the claims is illustrated as the cooling component or the top component.

FIGS. 20A-1, 20A-2, 20B-1, 20B-2, 20C-1, 20C-2, 20D, and 20E illustrate a fifteenth modification. In the present modification, the support portion 1 and the conductive portion are formed on each of the heat-generating component (bottom component) 30 and the cooling component (top component) 20, and an element is manufactured by joining the obtained components. Forming the support portion directly on each of the top component and the bottom component can improve the adhesion between the components and the support portion, and thus, can increase the joining strength between the top component and the bottom component.

Figure 21B:
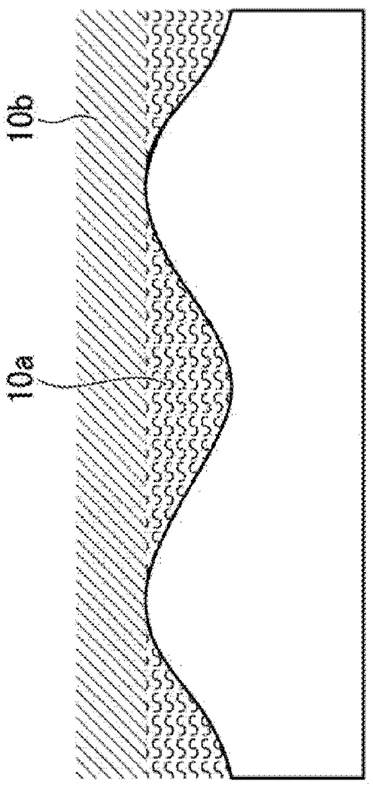
FIGS. 21A and 21B are cross-sectional views for explaining an eighth modification of the manufacturing method for the present embodiment.
Figure 21A:
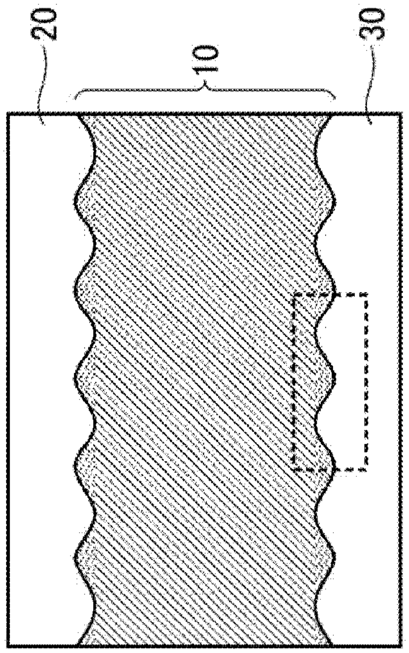

FIGS. 21A to 21B illustrate a sixteenth modification. FIG. 21A schematically illustrates an uneven surface of the component. FIG. 21B illustrates an enlarged view of a dotted frame in FIG. 21A. The conductive layer of the present application can be formed as a film at any location by an inkjet method. As illustrated in FIG. 21A, when a conductive layer (uneven portion) 10*a* is formed to fill a concave portion of the heat-generating component 30, the surface unevenness of the heat-generating component 30 can be decreased and a conductive layer (flat portion) 10*b* can be laminated. This structure can improve adhesion between the conductive layer and the component. Also, by preventing the formation of voids between the conductive layer and the component, it is possible to reduce the thermal contact resistance between the conductive layer and the component.

Figure 22A:
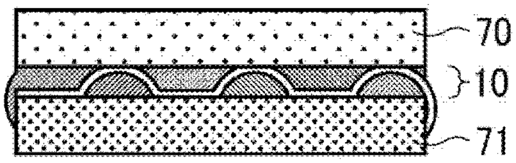
FIGS. 22A to 22E are cross-sectional views for explaining a ninth modification of the manufacturing method for the present embodiment.
Figure 22B:
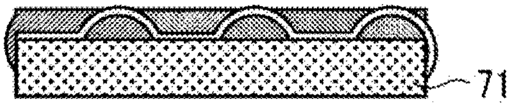
Figure 22C:
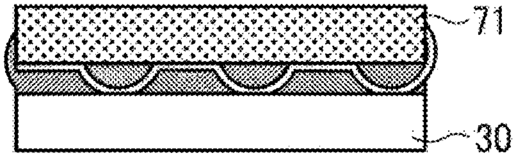
Figure 22D:
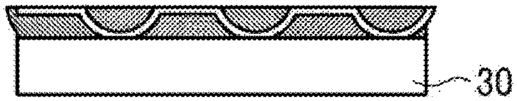
Figure 22E:
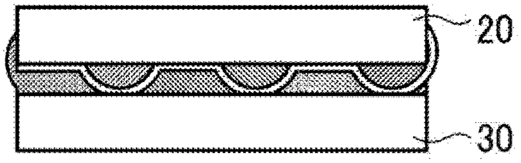

FIGS. 22A to 22E illustrate a seventeenth modification. The structure of the present application may or may not be formed on a component. The present modification illustrates, as an example, a structure formed on a film. FIG. 22A illustrates a structure formed on a release film 71 and having a protective layer 70. Such a structure formed on a film can be transferred to the heat-generating component 30 by heat-pressing or a transfer technique. An element structure can be formed by mounting the cooling component 20 on the transferred structure. Thus, the formed structure including the top component and the bottom component can be imparted with a function of adhering to a component, a function of conducting heat, and a function of conducting electricity.

When control is performed so that the area ratio of the conductive portion 2 is 7% or more and the film thickness of the conductive layer is 20 μm or less, the thermal resistance of the conductive layer can be reduced to about lower than 0.1 $cm^2$*° C./W, and thus, the thermal resistance can be reduced compared to that of a conventional gap filler of a conductive layer (paste-like conductive member) in which thermally conductive particles are mixed with a resin or a conventional sheet-like conductive layer. In the manufacturing, the inkjet method having the above-described characteristics is used. As a result, it is possible to form a pattern in which the area ratio of the conductive portion 2 is controlled after making the film thickness of the conductive layer 10 sufficiently thin, and it is possible to automate the manufacturing.

Figure 23:
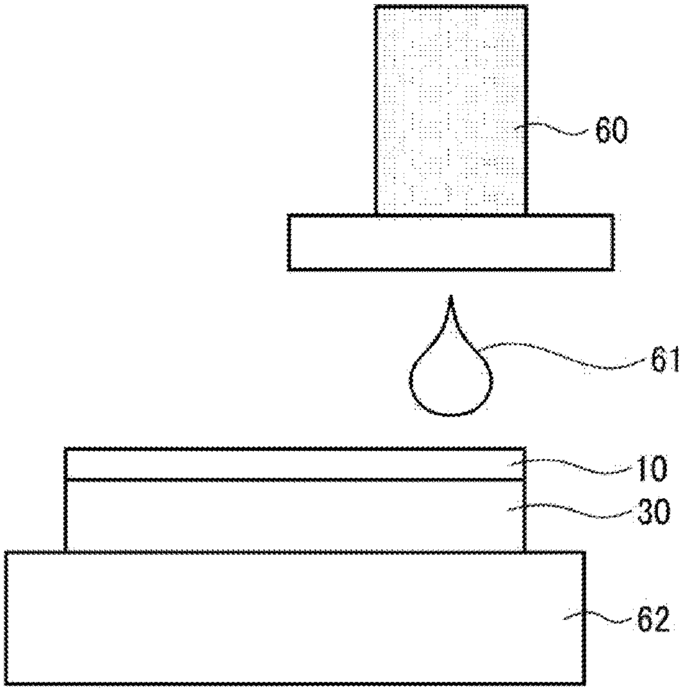
FIG. 23 is a diagram for explaining a manufacturing apparatus.

FIG. 23 illustrates a manufacturing apparatus for forming the conductive layer 10 by inkjet. An inkjet head 60 discharges ink 61. The heat-generating component 30 is fixed to a stage 62. The stage 62 can move in a three-dimensional manner and is controlled by a program recorded on a computer. The applying unit 60 that applies the ink for forming the conductive portion described in the claims refers to the inkjet head 60.

Figure 24:
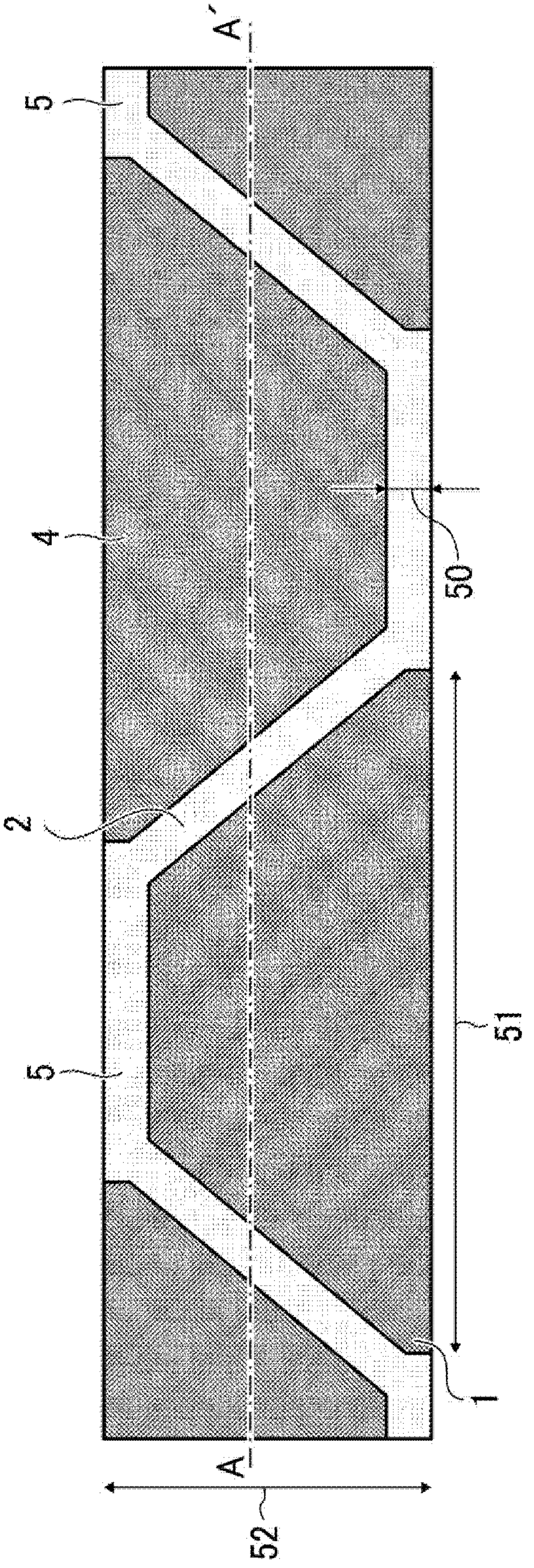
FIG. 24 is a detailed cross-sectional view of the conductive layer described in FIG. 7E.

FIG. 24 and Table 2 explain a specific shape of the conductive layer and a manufacturing method. FIG. 24 is an enlarged schematic diagram of a part of the conductive layer in FIG. 7E. A film thickness 52 of the conductive layer is represented by T, a width 51 of the support portion 1 by W, and a film thickness 50 of the conductive portion by tin. Table 2 presents T, W, tm, and an area ratio occupied by the conductive portion in a cross section A-A' of the conductive layer, excluding joining surfaces between the bottom component and the conductive laver and between the conductive layer and the top component.

Next, three-dimensional thermal simulation results based on the structures illustrated in FIG. 24 and FIGS. 25A to 25D are described. The thermal resistance of the conductive layer was obtained from 3D simulation results when the same ink for forming the support portion for the support portion 1 and the same ink for forming the conductive portion as in Example 1 were used.

<Simulation Condition>

Figure 26:
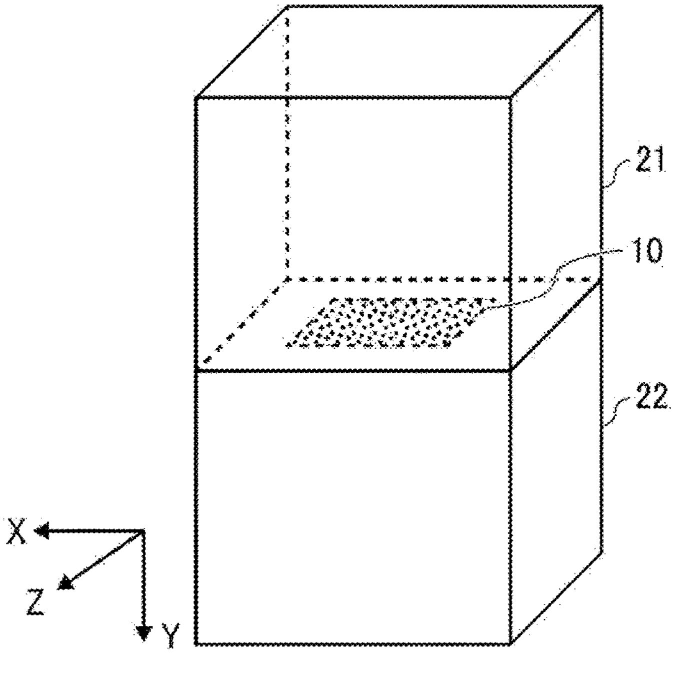
FIG. 26 is a diagram for explaining a simulation model.

As the thermal fluid simulation software, "STREAM V2020 SPi" was used. FIG. 26 illustrates an arrangement of the model. Copper blocks (21 and 22) each have a cube shape with a side of 30 mm were placed above and below the conductive layer 10. A heat generation condition of 100 W was applied to the copper block 21 on the −Y direction side, side surfaces were heat Insulated, and the copper block 22 on the +Y direction side was kept at a constant temperature. The conductive layer 10 having a square shape with a side of 15 mm was arranged in the center of the square plane between the copper block 21 and the copper block 22.

Figure 25A:
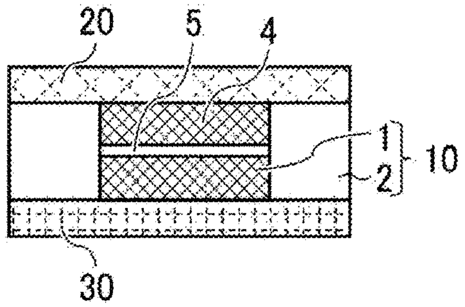
FIGS. 25A to 25D are diagrams for explaining simulated shapes.
Figure 25B:
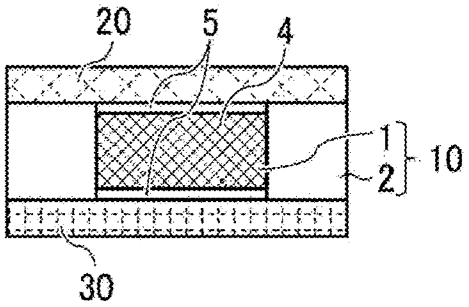
Figure 25C:
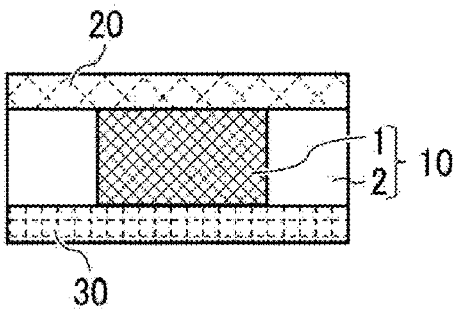
Figure 25D:
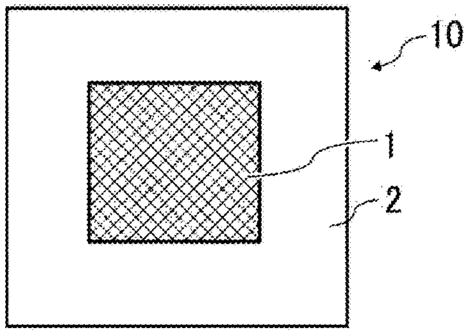

Examples 3-7 each had the structure illustrated in FIG. 24, and had the shape with the values indicated in Table 2. Comparative Example 1 contained the filler illustrated in FIG. 6. Example 8 and Example 9 have the structures illustrated in FIG. 25A and FIG. 25B, respectively. Comparative example 2 had the structure illustrated in FIG. 25C. The plan view of FIG. 25A to FIG. 25C is illustrated in FIG. 25D. The non-conductive portion 1 was arranged in the center and had a square shape with a side of 15 mm.

The analysis methods used were thermal, flow, steady-state analysis, and ¼ model. Mesh shape was a structure lattice, and the mesh was set to 100 elements (minimum 0.1 μm) in the thickness direction of the conductive layer.

The thermal conductivity of the material of the non-conductive portion 1 was set to 0.3 W/m×K. The thermal conductivity of the conductive portion 2 was determined from literature values to be 80 W/m×K (Non Patent Literature 1) (Examples 3 to 7) and 200 W/m×K (Non Patent Literature 2) (Example 8, Example 9, and Comparative Example 2). In Comparative Example 1, the thermal conductivity was calculated to be 5 W/m×K (Non Patent Literature 3) as commercially available silicone for heat dissipation.

[Non Patent Literature 1] Watanabe et al. "Silver Nanoparticle Pastes for Metal-Metal Joining at Low Temperature", 27th Japan Institute of Electronics Packaging Spring Conference, Preprints 13E-03, p 109-110.

[Non Patent Literature 2] Kanechiku et al. "Thermophysical Property Evaluation Technique for Sintered Bonding Materials", Kobelco Research Institute Technical Report, No. 50 Vol. 28 2020. April.

[Non Patent Literature 3] Shin-Etsu Chemical Co., Ltd. https://www.silicone.jp/products/function/heat/index.shtml (https://www.shinetsusilicone-global.com/products/function/heat/index.shtml).

TABLE 2

| | Film thickness T [μm] | Width of supporting member W [μm] | Film thickness of conductive member tm [μm] | Area ratio of conductive portion [%] | Arrangement of conductive portion | Thermal resistance $cm^2 \cdot C/W$ |
|---|---|---|---|---|---|---|
| Example 3 | 20 | 309 | 10 | 7 | FIG. 23 | 0.0925 |
| Example 4 | 20 | 206 | 10 | 8 | FIG. 23 | 0.0827 |
| Example 5 | 20 | 103 | 8 | 10 | FIG. 23 | 0.0667 |
| Example 6 | 20 | 103 | 10 | 13 | FIG. 23 | 0.0505 |
| Example 7 | 10 | 103 | 10 | 10 | FIG. 23 | 0.0463 |
| Comparative Example 1 | 15 | | | 100 | FIG. 6 | 0.1000 |
| Example 8 | 10 | 7500 | 1 | 25 | FIG. 25A | 0.0488 |
| Example 9 | 10 | 7500 | 1 | 25 | FIG. 25B | 0.0461 |
| Comparative Example 2 | 10 | 7500 | 0 | 25 | FIG. 25C | 0.0504 |

As described with reference to FIGS. 12A to 12E and FIGS. 13A to 13C, the support portion 1 and the filling portion 4 can be formed by an inkjet method. It is suitable to use an UV curable ink, so that a post-treatment step can be immediately performed by UV light irradiation. The conductive portion can be formed by the inkjet method. A nano-metal silver ink is suitable in that clogging of nozzles can be prevented and a metal film can be formed by sintering in a heat treatment at a relatively low temperature.

The inkjet method can form a dotted pattern, a line pattern, any pattern in which dots and lines are continuously connected, and a continuous film. Pattern formation in the inkjet method can realize a fine shape by discharging small droplets of several picoliter to several tens of picoliter. Specifically, an insulating pattern having a width of several tens of micrometers can be formed.

In addition, the film thickness can be controlled within a range of several nanometers to several tens of micrometers by adjusting the ink, adjusting the volume of droplets, adjusting the pattern of discharged droplets, and the like.

As indicated in Table 2, especially when the area ratio of the conductive portion is 7% or more and the thickness of the conductive layer is controlled to be 20 um or less, the thermal resistance of the conductive layer can be smaller than that of a conventional gap filler of a conductive layer (paste-like conductive member) in which thermally conductive particles are mixed with a resin as in Comparative Example 1 or a conventional sheet-like conductive layer.

As described above, examples of aspects of the present embodiment include, but are not limited to, the following.

Aspect 1

A member having a conductive layer 10 according to one embodiment of the present disclosure is a member including a base material 30 and the conductive layer 10 that conducts heat or electricity, in which the conductive layer 10 includes a conductive portion 2 that conducts heat or electricity and a non-conductive portion 1, the conductive portion 2 is disposed on at least one of an upper surface or a lower surface of the non-conductive portion 1 and on a side surface of the non-conductive portion 1. Thus, it is possible to provide a member having the conductive layer 10 that has excellent heat or electrical conduction function, adhesive strength of the conductive portion 2, strength of the conductive layer 10, stability, and reliability.

Specifically, the conductive portion 2 is disposed on at least one of the upper surface or the lower surface of the non-conductive portion 1 and on a side surface of the non-conductive portion 1, so that a contact area between the conductive portion 2 and the non-conductive portion 1 is increased and contact therebetween occurs from multiple directions, thereby increasing shearing stress and increasing fixing force of the conductive portion to the non-conductive portion 1. This prevents the conductivity from being deteriorated due to separation of the conductive portion 2.

Aspect 2

The member having the conductive layer 10 of this embodiment is the member according to aspect 1, which further includes another base material 20 that sandwiches the conductive layer between the base material 30 and the other base material 20. Thus, it is possible to provide a member having the conductive layer 10 that has excellent heat or electrical conduction function, adhesive strength of the conductive portion 2, strength of the conductive layer 10, stability, and reliability by sandwiching the conductive layer 10 between the base material 30 and the other base material 20.

<3>

The member having the conductive layer 10 of this embodiment is the member according to aspect 1 or 2, in which the conductive portion 2 is sandwiched by the non-conductive portion 1 and another non-conductive portion 4. The conductive portion 2 is sandwiched by the filling portion 4 from an upper portion and a side surface, and thus, the fixing force of the conductive portion to the support portion 1, which is the non-conductive portion 1, is further increased.

Aspect 4

The member having the conductive layer 10 of this embodiment is the member according to any one of aspects 1 to 3, in which the other non-conductive portion 4 includes a portion formed continuously between opposed ends of the conductive layer 10. This improves the strength of the conductive layer 10. Furthermore, since the conductive layer 10 is arranged in direct contact between the base material 30 and the other base material 20, the adhesion of the conductive layer 10 to the base material 30 and the other base material 20 is improved.

Aspect 5

The member having the conductive layer 10 of this embodiment is the member according to any one of aspects 1 to 4, in which the side surface of the non-conductive portion 1 is tapered. Therefore, when the filling portion 4, which is the non-conductive portion 1, receives a pressing force directed toward the upper surface of the support portion 1, the conductive portion 2 is pressed against the side surface of the support portion 1 by the pressing force, and thus, the sandwiching force is increased and the fixing force of the conductive portion 2 with respect to the side surface of the support portion 1 is improved.

Aspect 6

The member having the conductive layer 10 of this embodiment is the member according to any one of aspects 1 to 5 including a plurality of non-conductive portions 1 and a plurality of conductive portions 2, in which the plurality of conductive portions 2 are coupled. The plurality of conductive portions 2 are coupled by a bonding portion 5, which is part of the conductive portion 2. When the plurality of conductive portions 2 are coupled, any conduction path and conduction distribution can be formed, and thus, the conduction efficiency can be improved.

Aspect 7

The member having the conductive layer 10 of this embodiment is the member according to any one of aspects 1 to 6, in which the conductive portion is positioned on an end surface of the conductive layer. Therefore, the base material (heat-generating component 30) and/or the member to be conducted (cooling component 20) contact the conductive portion 2, and the contact resistance existing at the component interface can be reduced, and thus, the conduction efficiency of the conductive layer 10 is improved.

Aspect 8

The member having the conductive layer 10 of this embodiment is the member according to any one of aspects 1 to 7, in which a conductive material that forms a bonding portion 5 coupling the plurality of conductive portions 2 is formed of the same material as the plurality of conductive portions 2, and an average of areas of the plurality of conductive portions 2 positioned on an upper end surface and a lower end surface is larger than a cross-sectional area of the plurality of conductive portions 2 at a central portion of the conductive layer 10. This reduces contact resistance at the interface with the base material 30 and the other base material 20 and improves the conduction efficiency of the conductive layer 10.

Aspect 9

The member having the conductive layer of this embodiment is the member according to any one of aspects 1 to 8, in which a content of conductive particles in the conductive portion 2 is 60 vol % or more. As a result, high conductivity is obtained in the conductive portion 2, and consequently, a conductive layer 10 having a high conductivity is obtained.

Aspect 10

The member having the conductive layer of this embodiment is the member according to any one of aspects 1 to 9, in which the conductive portion 2 includes a metal nanoparticle sintering material. As a result, high conductivity is obtained in the conductive portion 2, and consequently, a conductive layer 10 having a high conductivity is obtained.

Aspect 11

The member having the conductive layer of this embodiment is the member according to any one of aspects 1 to 10, in which the non-conductive portion 1 contains a photocurable resin. Thus, arbitrary shapes of the support portion 1 can be easily formed, and a conductive layer 10 having a strong structure can be obtained.

Aspect 12

The member having the conductive layer 10 of this embodiment is the member according to any one of aspects 1 to 11, in which the non-conductive portion 1 contains an epoxy resin. Thus, the heat resistance and adhesion of the support portion 1 can be increased, and a conductive layer 10 having a strong structure can be obtained.

Aspect 13

A method for manufacturing a member of this embodiment includes forming a conductive layer 10 having a conductive portion 2 and a non-conductive portion 1 on a base material, in which the conductive layer 10 is formed by applying a conductive portion forming composition containing a thermally conductive material or an electrically conductive material to either an upper surface or a lower surface of the non-conductive portion and to a side surface of the non-conductive portion to make the conductive portion. Thus, it is possible to provide a member having the conductive layer 10 that has excellent heat or electrical conduction function, adhesive strength of the conductive portion 2, strength of the conductive layer 10, stability, and reliability. In the method for manufacturing a member of this embodiment, a cross section of the support portion 1 has a forward tapered shape. This facilitates layer formation without impairing the continuity of the conductive portion. In addition, when the filling portion 4 receives a pressing force directed toward the upper surface of the support portion 1, the conductive portion is pressed against the side surface of the support portion by a component of the pressing force, and thus, the fixing force of the conductive portion with respect to the side surface of the support portion 1 is improved.

Aspect 14

A conductive layer 10 of this embodiment includes a conductive portion 2 that conducts heat or electricity, and a non-conductive portion 1, and the conductive portion 2 is disposed on at least one of an upper surface or a lower surface of the non-conductive portion 1 and on a side surface of the non-conductive portion 1. This prevents the conductivity from being deteriorated due to separation of the conductive portion 2, so that a conductive layer that can maintain stable conductivity can be provided.

Aspect 15

A method for forming a conductive layer 10 of this embodiment is a method for forming a conductive layer 10 including a conductive portion 2 that conducts heat or electricity and a non-conductive portion 1, the method includes forming the conductive portion by applying a conductive portion forming composition containing a thermally conductive material or an electrically conductive material to either an upper surface or a lower surface of the non-conductive portion and to a side surface of the non-conductive portion. Thus, it is possible to provide a member having the conductive layer 10 that has excellent heat or electrical conduction function, adhesive strength of the non-conductive portion 1, strength of the conductive layer 10, stability, and reliability. In addition, the conductive portion 2 can be formed directly on the base material 20, which reduces contact resistance and improves conduction efficiency.

Aspect 16

A method for forming the conductive layer 10 of this embodiment is the method for forming the conductive layer according to aspect 15, the method includes forming another non-conductive portion 4 that sandwiches the conductive portion 2 together with the non-conductive portion 1 by applying a non-conductive portion forming composition into a space on a surface side of the conductive portion 2. This improves the strength of the conductive layer 10. In a case where the conductive layer 10 is arranged between the base material 30 and the member to be conducted 20, the adhesion of the conductive layer to the base material 30 and the member to be conducted is improved.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Any one of the above-described operations may be performed in various other ways, for example, in an order different from the one described above.

The invention claimed is:

1. A member, comprising:

a base material; and a conductive layer that conducts heat or electricity, wherein the conductive layer includes a conductive portion that conducts heat or electricity; and a non-conductive portion, the conductive portion is disposed on at least one of an upper surface of the non-conductive portion or a lower surface of the non-conductive portion; and on a side surface of the non-conductive portion, and the side surface of the non-conductive portion is tapered.

2. The member according to claim 1, further comprising another base material that sandwiches the conductive layer between the base material and said another base material.

3. The member according to claim 2, further comprising a filling portion disposed between the conductive portion and said another base material.

4. The member according to claim 1, further comprising another non-conductive portion, wherein the conductive portion is sandwiched by the non-conductive portion and said another non-conductive portion.

5. The member according to claim 4, wherein said another non-conductive portion includes a portion continuous between opposed ends of the conductive layer.

6. The member according to claim 1, further comprising:

a plurality of non-conductive portions including the non-conductive portion; and a plurality of conductive portions including the conductive portion, wherein the plurality of conductive portions are coupled.

7. The member according to claim 6, wherein a conductive material of a bonding portion coupling the plurality of conductive portions is the same as a conductive material of the plurality of conductive portions, and an average of areas of the plurality of conductive portions on an upper end surface and a lower end surface is larger than a cross-sectional area of the plurality of conductive portions at a central portion of the conductive layer.

8. The member according to claim 6, wherein the plurality of conductive portions are coupled by a bonding portion, and a thickness of the bonding portion is ⅓ or less of a thickness of the conductive layer.

9. The member according to claim 6, wherein the plurality of conductive portions includes a bonding portion disposed inside the conductive layer at a position spaced apart from an upper surface and a lower surface of the conductive layer.

10. The member according to claim 1, wherein the conductive portion is on an end surface of the conductive layer.

11. The member according to claim 1, wherein a content of conductive particles in the conductive portion is 60 percent by volume or more.

12. The member according to claim 1, wherein the conductive portion includes a metal nanoparticle sintering material.

13. The member according to claim 1, wherein the non-conductive portion contains a photocurable resin.

14. The member according to claim 1, wherein the non-conductive portion contains an epoxy resin.

15. The member according to claim 1, wherein the conductive layer includes a first portion that fills a concave portion of the base material and a second portion that is flat and laminated on the first portion.

16. The member according to claim 1, wherein the conductive portion is arranged in a ring-shaped pattern or a radial pattern.

17. A conductive layer, comprising:

a conductive portion that conducts heat or electricity; and a non-conductive portion, wherein the conductive portion is disposed on at least one of an upper surface or a lower surface of the non-conductive portion; and on a side surface of the non-conductive portion, and the side surface of the non-conductive portion is tapered.

* * * * *